US012607943B2

(12) United States Patent
Sohara

(10) Patent No.: US 12,607,943 B2
(45) Date of Patent: Apr. 21, 2026

(54) EXPOSURE APPARATUS

(71) Applicant: Ushio Denki Kabushiki Kaisha, Tokyo (JP)

(72) Inventor: Naoya Sohara, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 107 days.

(21) Appl. No.: 18/591,713

(22) Filed: Feb. 29, 2024

(65) Prior Publication Data

US 2024/0329545 A1 Oct. 3, 2024

(30) Foreign Application Priority Data

Mar. 29, 2023 (JP) ................................. 2023-053551

(51) Int. Cl.
*G03F 7/00* (2006.01)

(52) U.S. Cl.
CPC ...... *G03F 7/70775* (2013.01); *G03F 7/70058* (2013.01); *G03F 7/70258* (2013.01); *G03F 7/70716* (2013.01); *G03F 7/7085* (2013.01)

(58) Field of Classification Search
CPC ............. G03F 7/70775; G03F 7/70058; G03F 7/70258; G03F 7/70716; G03F 9/7088; G03F 7/70725; G03F 7/7025; G03F 7/70266; G03F 7/70275; G03F 7/70283; G03F 7/703; G03F 7/70308; G03F 7/70316; G03F 7/707; G03F 7/70708; G03F 7/70733; G03F 7/70741; G03F 7/70758; G03F 7/708; G03F 7/70808; G03F 7/70816; G03F 7/7085; G03F 7/70841;

(Continued)

(56) References Cited

U.S. PATENT DOCUMENTS

| 4,506,977 A * | 3/1985 | Sato | ..................... G03F 7/70241 |
| | | | 355/56 |
| 2004/0057032 A1* | 3/2004 | Hara | ....................... G03F 7/709 |
| | | | 355/53 |

(Continued)

FOREIGN PATENT DOCUMENTS

| JP | H08-233529 A | 9/1996 |
| JP | 2006-32807 A | 2/2006 |

(Continued)

*Primary Examiner* — Christina A Riddle

(74) *Attorney, Agent, or Firm* — Studebaker Brackett PLLC

(57) ABSTRACT

An exposure apparatus includes: a light-emission unit that emits exposure light; a mask stage that holds an exposure mask; a workpiece stage that holds a workpiece; a projection optical system that irradiates the workpiece held by the workpiece stage with the exposure light, the exposure light being emitted from the light-emission unit and passing through the exposure mask; a holding member that holds the projection optical system and is connected to the mask stage; a relative-position changing mechanism that changes at least one of a relative position or a relative angle of the exposure mask relative to the projection optical system; and a sensor mechanism that detects the at least one of the relative position or the relative angle of the exposure mask relative to the projection optical system, the at least one of the relative position or the relative angle being changed by the relative-position changing mechanism.

15 Claims, 11 Drawing Sheets

(58) Field of Classification Search
CPC ............. G03F 7/70833; G03F 7/70825; G03F
7/70483; G03F 7/70491; G03F 7/705;
G03F 7/70504; G03F 7/70508; G03F
7/70516; G03F 7/70525; G03F 7/70533;
G03F 7/70541; G03F 7/7055; G03F
7/70558; G03F 7/70566; G03F 7/70575;
G03F 7/70583; G03F 7/70591; G03F
7/706; G03F 7/70858; G03F 7/70866;
G03F 7/70875; G03F 7/70883; G03F
7/70891; G03F 7/709; G03F 7/7095;
G03F 7/70975; G03F 7/70983; G03F
7/70941; G03F 7/70908; G03F 9/7049;
G03F 9/7023; G03F 9/7026; G03F 9/703;
G03F 9/7034; G03F 9/7096; G03F
7/70691–70791
USPC ............................ 355/18, 30, 52–55, 66–77
See application file for complete search history.

(56)                    References Cited

U.S. PATENT DOCUMENTS

2010/0157263 A1 *    6/2010   Van Eijk ............... G03F 7/7085
                                                    356/614
2011/0032496 A1 *    2/2011   Shibazaki ........... G03F 7/70725
                                                    74/490.09
2018/0341183 A1 *   11/2018   Shimoyama ........ G03F 7/70775

FOREIGN PATENT DOCUMENTS

JP          2006-261418  A      9/2006
JP          2006-269669  A     10/2006

* cited by examiner (Without control of relative inclination)

M

3(13)

(Workpiece viewed from above (ideal state))

W (Control of relative inclination)

M

3(13)

(Workpiece viewed from above (distorted))

W

EXPOSURE APPARATUS

CROSS REFERENCE TO RELATED APPLICATIONS

This application claims the benefit of Japanese Priority Patent Application JP 2023-053551 filed Mar. 29, 2023, the entire contents of which are incorporated herein by reference.

BACKGROUND

The present invention relates to an exposure apparatus including a projection optical system.

SUMMARY

Exposure apparatuses are used in the step of manufacturing a pattern of a semiconductor element, a printed-circuit board, a liquid crystal substrate, or the like by photolithography. The exposure apparatus performs alignment such that a mask (reticle) on which a pattern is formed and a workpiece to which the pattern is to be transferred have a predetermined positional relationship. Subsequently, the exposure apparatus irradiates, by a projection optical system, the workpiece with exposure light with which the mask is irradiated, so that the mask pattern is transferred (exposed) to the workpiece.

Japanese Patent Application Laid-open No. Hei 08-233529 discloses an alignment unit (also referred to as alignment microscope) for performing alignment of a mask and a workpiece in an exposure apparatus as described above. A mask mark formed on the mask and a workpiece mark formed on the workpiece are imaged by the alignment unit. Positional coordinates of the mask mark and the workpiece mark are calculated on the basis of the captured images of the mask mark and the workpiece mark. At least one of the mask or the workpiece is moved such that the positions of both the mask and the workpiece have a positional relationship set in advance.

In the exposure apparatus disclosed in Japanese Patent Application Laid-open No. Hei 08-233529, a reflective member that is a total reflection mirror or a half mirror is embedded into the substantially entire surface of the workpiece stage. A mask mark projected onto the reflective member is imaged by the alignment unit in the step of detecting a mask mark.

Japanese Patent Application Laid-open Nos. 2006-32807, 2006-261418, and 2006-269669 disclose exposure apparatuses in which a laser interferometer or an oblique-incidence position detector is disposed so as to detect a position or the like of a mask or a workpiece.

In recent years, the miniaturization of a wiring pattern or the like has become increasingly advanced, and a further improvement in exposure accuracy has been expected.

In view of the circumstances as described above, it is desirable to provide an exposure apparatus capable of achieving high exposure accuracy.

According to an embodiment of the present invention, there is provided an exposure apparatus including a light-emission unit, a mask stage, a workpiece stage, a projection optical system, a holding member, a relative-position changing mechanism, and a sensor mechanism.

The light-emission unit emits exposure light.

The mask stage holds an exposure mask.

The workpiece stage holds a workpiece.

The projection optical system irradiates the workpiece held by the workpiece stage with the exposure light, the exposure light being emitted from the light-emission unit and passing through the exposure mask.

The holding member holds the projection optical system and is connected to the mask stage.

The relative-position changing mechanism changes at least one of a relative position or a relative angle of the exposure mask relative to the projection optical system.

The sensor mechanism detects the at least one of the relative position or the relative angle of the exposure mask relative to the projection optical system, the at least one of the relative position or the relative angle being changed by the relative-position changing mechanism.

In such an exposure apparatus, the holding member that holds the projection optical system is connected to the mask stage. Further, the relative-position changing mechanism changes at least one of the relative position or the relative angle of the exposure mask relative to the projection optical system. Further, the sensor mechanism detects at least one of the relative position or the relative angle. This makes it possible to achieve high exposure accuracy.

The relative-position changing mechanism may change at least one of a relative distance of the exposure mask relative to the projection optical system in an optical axis direction of the exposure light emitted from the light-emission unit, a relative position of the exposure mask relative to the projection optical system in a plane direction perpendicular to the optical axis direction, or a relative inclination of the exposure mask relative to the projection optical system.

The relative-position changing mechanism may change the relative inclination of the exposure mask relative to the projection optical system.

The sensor mechanism may detect at least one of a relative distance of the exposure mask relative to the projection optical system in an optical axis direction of the exposure light emitted from the light-emission unit, a relative position of the exposure mask relative to the projection optical system in a plane direction perpendicular to the optical axis direction, or a relative inclination of the exposure mask relative to the projection optical system.

The sensor mechanism may detect the relative inclination of the exposure mask relative to the projection optical system.

The relative-position changing mechanism may include at least one of a mask-side moving mechanism that changes at least one of a relative position or a relative angle of the exposure mask relative to the mask stage, or a stage-side moving mechanism that changes at least one of a relative position or a relative angle of the mask stage relative to the holding member.

The mask stage may include a connection member that is connected to the holding member, and a mask-holding member that holds the exposure mask. In this case, the mask-side moving mechanism may change at least one of a relative position or a relative angle of the mask-holding member relative to the connection member.

The mask stage may include a connection member that is connected to the holding member, and a mask-holding member that holds the exposure mask. In this case, The stage-side moving mechanism may change at least one of a relative position or a relative angle of the connection member relative to the holding member.

The sensor mechanism may include one or more detection sensors that are capable of detecting at least one of a position or an angle of an object to be detected.

At least one of the one or more detection sensors may be fixed to the holding member.

The mask stage may include a connection member that is connected to the holding member, and a mask-holding member that holds the exposure mask. In this case, the one or more detection sensors may include at least one of a mask-side detection sensor that sets the exposure mask or the mask-holding member as an object to be detected, or an optical-system-side detection sensor that sets the holding member as an object to be detected.

The one or more detection sensors may include at least one of the mask-side detection sensor that is fixed to the holding member, or the optical-system-side detection sensor that is fixed to the mask-holding member.

The one or more detection sensors may include at least one of three mask-side detection sensors that set three different positions of the exposure mask or the mask-holding member as objects to be detected, or three optical-system-side detection sensors that set three different positions of the holding member as objects to be detected.

The one or more detection sensors may include three mask-side detection sensors that are fixed to the holding member with the three different positions of the exposure mask or the mask-holding member as objects to be detected.

The one or more detection sensors may include three optical-system-side detection sensors that are fixed to the mask-holding member with the three different positions of the holding member as objects to be detected.

The one or more detection sensors may include at least one of a laser interferometer or an autocollimator.

As described above, according to the present invention, it is possible to achieve high exposure accuracy. Note that the effects described herein are not necessarily limited and may be any effect described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments according to the present invention will be described with reference to the drawings.

[Configuration of Exposure Apparatus]

Figure 1:
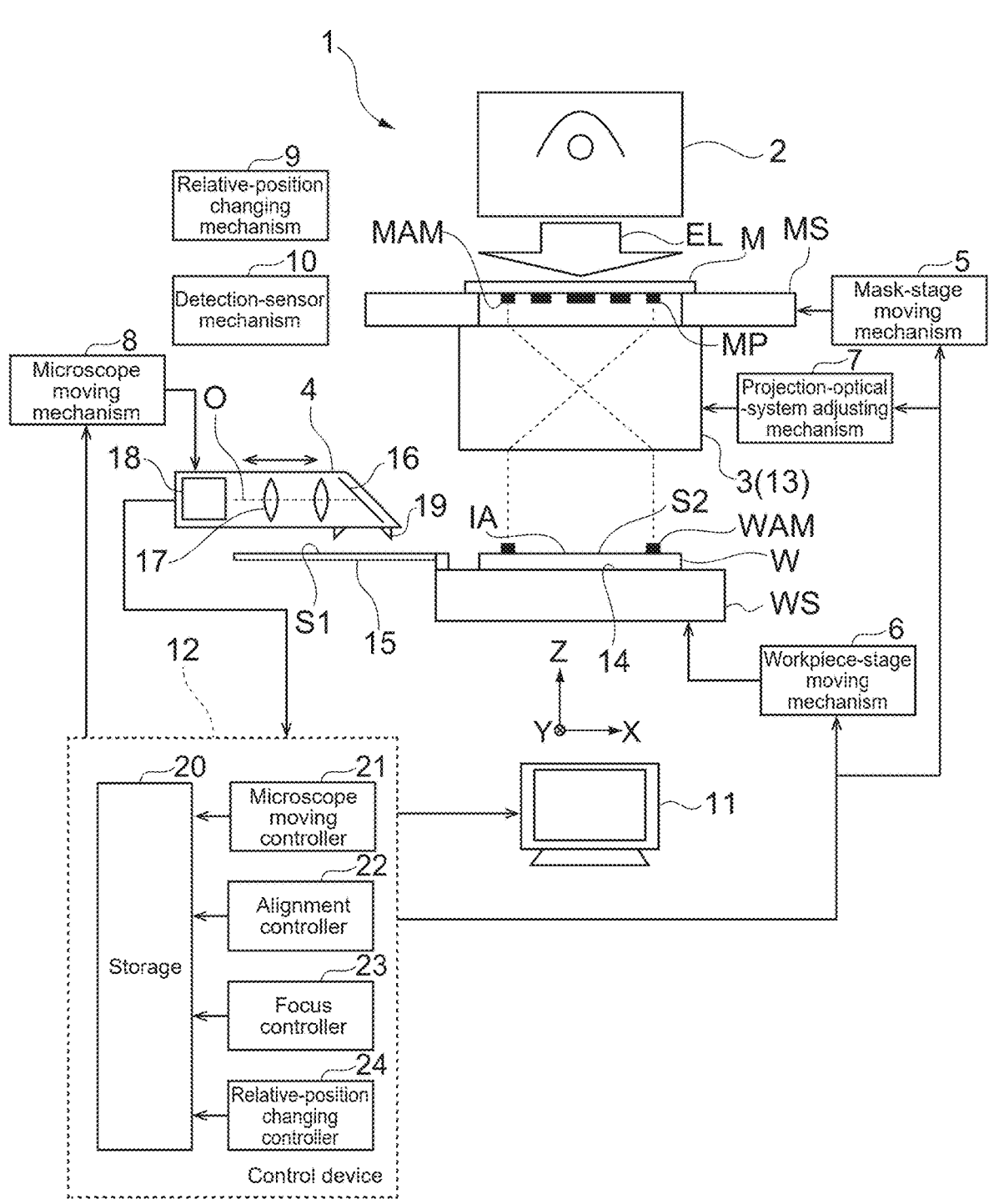
FIG. 1 is a schematic diagram showing a basic configuration example of an exposure apparatus according to one embodiment of the present invention.

FIG. 1 is a schematic diagram showing a basic configuration example of an exposure apparatus according to one embodiment of the present invention.

The exposure apparatus 1 includes a light-emission unit 2, a mask stage MS, a workpiece stage WS, a projection optical system 3, an alignment microscope 4, a mask-stage moving mechanism 5, a workpiece-stage moving mechanism 6, a projection-optical-system adjusting mechanism 7, a microscope moving mechanism 8, a relative-position changing mechanism 9, a detection-sensor mechanism 10, a monitor 11, and a control device 12.

Hereinafter, as shown in FIG. 1, an optical axis direction of the light-emission unit 2 (emission direction of exposure light EL) will be referred to as a Z direction, the positive side of the Z axis as an upper side, and the negative side thereof as a lower side. Further, a direction orthogonal to the Z direction and extending in the right and left of the figure will be referred to as an X direction, the positive side of the X axis as a right side, and the negative side thereof as a left side. Further, a depth direction orthogonal to the Z direction and the X direction and extending perpendicularly to the plane of the figure will be referred to as a Y direction, the positive side of the Y axis as a far side, and the negative side thereof as a near side. As a matter of course, for the application of the present technology, a direction in which the exposure apparatus 1 is disposed and the like are not limited.

The light-emission unit 2 emits exposure light EL toward the lower side. For example, a short-arc mercury lamp is used as the light-emission unit 2. For example, ultraviolet light including the wavelengths of 365 nm (i-line), 405 nm (h-line), 436 nm (g-line), and the like is emitted from the mercury lamp. As a matter of course, the present invention is not limited to such a configuration. A lamp that emits light in a wavelength band different from that of the ultraviolet light may be used. In addition, a solid-state light source such as a light-emitting diode (LED) or a laser diode (LD) may be used.

The mask stage MS is disposed on the lower side of the light-emission unit 2. The mask stage MS holds an exposure mask (hereinafter, simply referred to as mask) M. In this embodiment, the mask M is disposed to be orthogonal to the optical axis direction of the light-emission unit 2 (Z direction). The mask M includes a predetermined mask pattern MP formed thereon. Further, the mask M includes an alignment mark (mask mark) MAM formed thereon. The mask mark MAM is also referred to as a mask/alignment mark.

The projection optical system 3 irradiates a workpiece W, which is held by the workpiece stage WS, with the exposure light EL emitted from the light-emission unit 2 and transmitted through the mask M. Thus, an image of the mask pattern MP formed on the mask M is projected onto the workpiece W. The projection optical system 3 is configured as an image-forming optical system including a projection lens. A specific configuration of the projection optical system 3 is not limited, and any configuration may be employed.

The projection optical system 3 including the projection lens is held by a lens barrel 13 and installed into the exposure apparatus 1. In FIG. 1, the lens barrel 13 is denoted by the reference symbol of the projection optical system 3.

As shown in FIG. 1, in this embodiment, the lens barrel 13 that holds the projection optical system 3, and the mask stage MS are connected to each other. The mask stage MS may be fixed to the lens barrel 13, or the mask stage MS may be movably connected to the lens barrel 13.

Note that "connection" between members in the present disclosure is not limited to a case where a member is directly connected to a member to be connected, and incudes a case where members are connected via another physical member. For example, connection between a member A and a member B includes a form in which the member A and the member B are connected to each other via another member such as a hinge or an actuator. In other words, a connection form in which another member such as a hinge or an actuator is interposed between the member A and the member B is also included.

In this embodiment, the lens barrel 13 corresponds to one embodiment of a holding member according to the present invention, which holds the projection optical system and is connected to the mask stage.

The workpiece stage WS holds the workpiece W. In this embodiment, the workpiece W is disposed to be orthogonal to the optical axis direction of the light-emission unit 2 (Z direction).

The workpiece stage WS includes a placement surface (placement region) 14 on which the workpiece W is placed. The placement surface 14 includes a plurality of vacuum-suction holes formed therein, and the workpiece W is held by vacuum suction. Note that a specific configuration or method for holding the workpiece W is not limited and may be discretionally designed.

The mask-stage moving mechanism 5 linearly moves (performs linear motion of) the mask stage MS in each of the horizontal direction (X direction), the depth direction (Y direction), and the vertical direction (Z direction). Further, the mask-stage moving mechanism 5 rotates the mask stage MS with the vertical direction (Z direction) being used as a rotation-axis direction. Further, the mask-stage moving mechanism 5 tilts (inclines) the mask stage MS relative to the optical axis direction of the light-emission unit 2 (Z direction).

In this embodiment, the mask stage MS and the lens barrel 13 are connected to each other. Therefore, when the mask-stage moving mechanism 5 is driven, the mask stage MS and the lens barrel 13 can be moved together. As described above, if the mask stage MS is movably connected to the lens barrel 13, for example, it is possible to cooperate control to move the mask stage MS and the lens barrel 13 together and control to move the mask stage MS relative to the lens barrel 13 with the lens barrel 13 being fixed.

The workpiece-stage moving mechanism 6 linearly moves the workpiece stage WS in each of the horizontal direction (X direction), the depth direction (Y direction), and the vertical direction (Z direction). Further, the workpiece-stage moving mechanism 6 rotates the workpiece stage WS with the vertical direction (Z direction) being used as a rotation-axis direction. Furthermore, the workpiece-stage moving mechanism 6 tilts the workpiece stage WS relative to the optical axis direction of the light-emission unit 2 (Z direction).

Each of the mask-stage moving mechanism 5 and the workpiece-stage moving mechanism 6 is driven, so that a relative position of the workpiece W relative to the mask M can be varied.

Specific configurations of the mask-stage moving mechanism 5 and the workpiece-stage moving mechanism 6 are not limited. For example, any moving mechanism such as a linear stage using a stepping motor or the like, any rotary mechanism using a gear mechanism or the like, and other mechanisms may be used.

For example, the workpiece stage WS is disposed on a surface plate (platen) and is moved in a state of being magnetically elevated by a linear motor. Such a configuration can also be employed. In this case, the whole including the surface plate will be referred to as a workpiece stage, and a workpiece stage WS holding the workpiece W can also be referred to as a mobile object.

Further, as the configurations of the mask-stage moving mechanism 5 and the workpiece-stage moving mechanism 6, any configuration capable of varying a relative position relationship of the workpiece stage WS relative to the mask stage MS can be employed.

For example, only the mask-stage moving mechanism 5 may be provided, and only the mask stage MS may be movable. Alternatively, only the workpiece-stage moving mechanism 6 may be provided, and only the workpiece stage WS may be movable. Further, regarding the movement in the horizontal direction (X direction), the depth direction (Y direction), and the vertical direction (Z direction), the mask-stage moving mechanism 5 moves the mask stage MS. Regarding the rotation with the vertical direction (Z direction) being used as a rotation-axis direction and regarding the tilt (inclination) relative to the optical axis direction (Z direction), the workpiece-stage moving mechanism 6 moves the workpiece stage WS. Such a configuration can also be employed.

The workpiece W includes an alignment mark (workpiece mark) WAM formed thereon. The workpiece mark WAM is also referred to as a workpiece/alignment mark.

In rotation directions in which the horizontal direction (X direction), the depth direction (Y direction), and the vertical direction (Z direction) are rotation-axis directions, it is desirable to form three or more mask marks MAM on the mask M in order to align the mask M and the workpiece W. The same number of workpiece marks WAM is formed on the workpiece W so as to correspond to the three or more mask marks MAM.

For example, it is assumed that a mask M having a rectangular shape as viewed from the vertical direction (Z direction) is used. In this case, for example, the mask marks MAM are formed at four corners of the mask M. Further, a substrate having a rectangular shape as viewed from the vertical direction (Z direction) is disposed as the workpiece W. The workpiece marks WAM are formed at four corners of the workpiece W so as to correspond to the mask marks MAM formed at the four corners of the mask M. As a matter of course, the present invention is not limited to such a configuration.

The mask mark MAM and the workpiece mark WAM corresponding to each other are formed to have a predetermined positional relationship if the mask M and the workpiece W have a desired positional relationship as viewed from the vertical direction (Z direction). In this embodiment, description will be given assuming that the mask mark MAM and the workpiece mark WAM corresponding to each other are located at the same position if the mask M and the workpiece W have a desired positional relationship. As a matter of course, the present invention is not limited to such a setting, and any positional relationship may be set as a predetermined positional relationship.

As shown in FIG. 1, a reflective member 15 is connected to and fixed at a left end portion of the workpiece stage WS. The reflective member 15 is connected to the workpiece stage WS such that a height position of an upper surface S1 of the reflective member 15 is equal to a height position of an upper surface S2 of the workpiece W placed on the placement surface 14. The reflective member 15 is moved integrally with the workpiece stage WS.

As the reflective member 15, for example, a total reflection mirror, a half mirror, or the like is used. In addition, in the step of detecting the mask mark MAM to be described later, any configuration may be employed as the reflective member 15 if the mask mark MAM projected onto the reflective member 15 can be imaged.

Further, the reflective member 15 is configured to have a size equal to or larger than the size of an irradiation region IA for the exposure light EL transmitted through the mask M and radiated by the projection optical system 3 as viewed from above. Typically, the reflective member 15 is configured to have a size larger than the size of the irradiation region IA for the exposure light EL. In other words, the reflective member 15 is configured to have a size that covers the irradiation region IA for the exposure light EL. Note that the irradiation region IA for the exposure light EL is an exposure surface that can be exposed in the exposure step for the workpiece W.

It is assumed that the workpiece-stage moving mechanism 6 is driven, and the reflective member 15 connected to the workpiece stage WS is disposed at a position on the optical axis of the exposure light EL on the lower side of the projection optical system 3. When the exposure light EL is radiated in that state, the whole of the exposure light EL radiated by the projection optical system 3 is reflected by the reflective member 15.

Therefore, image light of the mask M is formed on the reflective member 15 and the whole image of the mask M appears on the reflective member 15. As a matter of course, an image of the mask mark MAM also appears on the reflective member 15.

The projection-optical-system adjusting mechanism 7 adjusts the projection optical system 3. For example, when the projection-optical-system adjusting mechanism 7 is driven, adjustment of a focus position, adjustment of an image-forming magnification, correction of distortion, and the like are performed. For example, adjustment of a position, processing, replacement, or the like of an optical element such as the projection lens included in the projection optical system 3 makes it possible to adjust the projection optical system 3. A specific configuration of the projection-optical-system adjusting mechanism 7 is not limited, and any configuration may be employed.

The microscope moving mechanism 8 linearly moves the alignment microscope 4 in each of the horizontal direction (X direction), the depth direction (Y direction), and the vertical direction (Z direction). Note that the microscope moving mechanism 8 may rotate the alignment microscope 4 with the vertical direction (Z direction) being used as a rotation-axis direction. Further, the microscope moving mechanism 8 may be capable of tilting the alignment microscope 4 relative to the optical axis direction of the light-emission unit 2 (Z direction).

When the microscope moving mechanism 8 is driven, the alignment microscope 4 can be moved from an imaging position, which is between the projection optical system 3 and the workpiece stage WS (workpiece W) (see FIGS. 2 and 3), to a retracted position shown in FIG. 1.

If the alignment microscope 4 is movable between the imaging position and the retracted position, a movable direction may be limited. For example, a configuration that allows only a linear motion in each of the horizontal direction (X direction), the depth direction (Y direction), and the vertical direction (Z direction) may be employed. Alternatively, a configuration capable of moving only in the horizontal direction (X direction) may also be employed.

A specific configuration of the microscope moving mechanism 8 is not limited. For example, any moving mechanism such as a linear stage using a stepping motor or the like, any rotary mechanism using a gear mechanism or the like, and other mechanisms may be used.

The relative-position changing mechanism 9 changes at least one of a relative position or a relative angle of the mask M relative to the projection optical system 3. Note that the projection optical system 3 is held by the lens barrel 13 and fixed thereto. Therefore, the relative position and the relative angle of the mask M relative to the projection optical system 3 correspond to at least one of the relative position or the relative angle of the mask M relative to the lens barrel 13. In other words, changing at least one of the relative position or the relative angle of the mask M relative to the projection optical system 3 makes it possible to change at least one of the relative position or the relative angle of the mask M relative to the lens barrel 13.

In this embodiment, the relative-position changing mechanism 9 can change a relative distance of the mask M relative to the projection optical system 3 (lens barrel 13) in the optical axis direction (Z direction) of the exposure light EL emitted from the light-emission unit 2, a relative position of the mask M relative to the projection optical system 3 (lens barrel 13) in the horizontal direction (XY-plane direction) perpendicular to the optical axis direction (Z direction), and a relative inclination of the mask M relative to the projection optical system 3 (lens barrel 13). In other words, in this embodiment, it is possible to change both the relative position and the relative angle of the mask M relative to the projection optical system 3.

Note that the configuration of the relative-position changing mechanism 9 is not limited to the configuration capable of changing all of the relative distance in the optical axis direction (Z direction), the relative position in the horizontal direction (XY-plane direction), and the relative inclination. A configuration in which one parameter of those above or parameters in any combination of those above can be changed may be employed. For example, only the relative inclination (relative angle) may be changed.

The detection-sensor mechanism 10 detects at least one of the relative position or the relative angle of the mask M relative to the projection optical system 3 (lens barrel 13), the relative position or the relative angle being changed by the relative-position changing mechanism 9. The detection-sensor mechanism 10 detects, for example, the relative distance of the mask M relative to the projection optical system 3 (lens barrel 13) in the optical axis direction (Z direction) of the exposure light EL emitted from the light-emission unit 2, the relative position of the mask M relative to the projection optical system 3 (lens barrel 13) in the horizontal direction (XY-plane direction) perpendicular to the optical axis direction (Z direction), and the relative inclination of the mask M relative to the projection optical system 3 (lens barrel 13). In other words, in this embodiment, it is possible to detect both the relative position and the relative angle of the mask M relative to the projection optical system 3.

All of the relative distance in the optical axis direction (Z direction), the relative position in the horizontal direction (XY-plane direction), and the relative inclination may be detectable, or one parameter of those above or parameters in any combination of those above may be detectable. For example, only the relative inclination may be detectable.

The alignment microscope 4 is used for alignment of the mask M and the workpiece W. The alignment microscope 4 can capture an enlarged image of the mask mark MAM and an enlarged image of the workpiece mark WAM.

The alignment microscope 4 has a roughly columnar shape extending in one direction and incorporates a beam splitter 16, a lens system 17, and an optical sensor 18.

Inside the alignment microscope 4, the beam splitter 16, the lens system 17, and the optical sensor 18 are disposed with an imaging optical axis O of the optical sensor 18 being used as a reference.

As the beam splitter 16, any configuration capable of splitting incident light to emit the split light to the optical sensor 18 may be employed. For example, beam splitters having various configurations, such as a plate beam splitter, a pellicle beam splitter, and a cube beam splitter, may be used.

As the lens system 17, any configuration including an objective lens or the like may be employed. For example, if a cube beam splitter is used, an aberration correction lens may be disposed as the lens system 17.

In this embodiment, an imaging device (imaging unit) capable of capturing a two-dimensional image is used as the optical sensor 18. For example, a digital camera including an image sensor such as a charge-coupled device (CCD) sensor or a complementary metal-oxide semiconductor (CMOS) sensor can be used. The present invention is not limited to the above, and a digital camera using an image-forming lens such as a non-telecentric lens or a telecentric lens and the image sensor in combination may be used.

Further, an illumination unit 19 is disposed at a position on the lower side of the beam splitter 16 of the alignment microscope 4. The illumination unit 19 emits non-exposure light NEL (see FIG. 3) toward the lower side. For example, a ring lighting is used as the illumination unit 19, and visible light is emitted as the non-exposure light NEL. As a matter of course, the present invention is not limited to such a configuration, and a configuration in which a coaxial illumination method is performed may be employed.

The control device 12 controls an operation of each block of the exposure apparatus 1. The control device 12 includes hardware necessary for the computer, for example, a processor such as a central processing unit (CPU), a graphics processing unit (GPU), or a digital signal processor (DSP), a memory such as a read-only memory (ROM) or a random access memory (RAM), and a storage device such as a hard disk drive (HDD). In this embodiment, storage 20 is formed by a storage device such as a nonvolatile memory. In order to implement the storage 20, any non-transitory computer-readable storage medium may be used.

The processor of the control device 12 loads a program according to the present technology, which is stored in the storage 20 or the memory, to the RAM and executes the program, so that an alignment method, a method of changing the relative position and the relative angle of the mask M relative to the projection optical system 3 (lens barrel 13), and an exposure method including a focus control method according to the present technology are executed.

For example, any computer such as a personal computer (PC) can implement the control device 12. As a matter of course, hardware including a programmable logic device (PLD) such as a field-programmable gate array (FPGA), an application specific integrated circuit (ASIC), or the like may be used.

In this embodiment, the processor of the control device 12 executes the program according to the present technology, and thus a microscope moving controller 21, an alignment controller 22, a focus controller 23, and a relative-position changing controller 24 are implemented as functional blocks.

The microscope moving controller 21 controls the microscope moving mechanism 8 to move the alignment microscope 4. In the step of detecting the mask mark MAM and the step of detecting the workpiece mark WAM, the alignment microscope 4 is moved to the imaging position between the projection optical system 3 and the workpiece stage WS (workpiece W) (see FIGS. 2 and 3). In the exposure step for the workpiece W, the alignment microscope 4 is moved to the retracted position as shown in FIG. 1.

The alignment controller 22 detects each of a position of the mask mark MAM and a position of the workpiece mark WAM on the basis of an image of the mask mark MAM and an image of the workpiece mark WAM, which are captured by the optical sensor 18 of the alignment microscope 4.

Further, on the basis of the detected position of the mask mark MAM and the detected position of the workpiece mark WAM, the alignment controller 22 controls the mask-stage moving mechanism 5 and the workpiece-stage moving mechanism 6 to perform alignment such that the mask M and the workpiece W have a desired positional relationship. Specifically, the alignment controller 22 controls the mask-stage moving mechanism 5 and the workpiece-stage moving mechanism 6 such that the mask mark MAM and the workpiece mark WAM are located at the same position, that is, have a predetermined positional relationship. This makes it possible to align the mask M and the workpiece W.

The focus controller 23 controls the focus of the mask pattern MP, which is projected (image-formed) onto the workpiece W. Specifically, the focus controller 23 controls the projection-optical-system adjusting mechanism 7, the mask-stage moving mechanism 5, and the workpiece-stage moving mechanism 6 such that the workpiece W is disposed at a focus position of the projection optical system 3.

In this embodiment, as the focus control, the focus position of the projection optical system 3 is adjusted by driving the projection-optical-system adjusting mechanism 7, the position of the mask stage MS in the vertical direction (Z direction) is adjusted by driving the mask-stage moving mechanism 5, and the position of the workpiece stage WS in the vertical direction (Z direction) is adjusted by driving the workpiece-stage moving mechanism 6. As a matter of course, the present invention is not limited to such control, an any focus control may be executed.

For example, any of the adjustment of the focus position of the projection optical system 3, the adjustment of the position of the mask stage MS in the vertical direction (Z direction), and the adjustment of the position of the work-piece stage WS in the vertical direction (Z direction) may be executed.

The relative-position changing controller 24 drives the relative-position changing mechanism 9 to change the relative position and the relative angle of the mask M relative to the projection optical system 3 (lens barrel 13). In this embodiment, the relative-position changing controller 24 can control the relative position and the relative angle highly accurately on the basis of detection results of the relative position and the relative angle of the mask M relative to the projection optical system 3 (lens barrel 13), the detection results being detected by the detection-sensor mechanism 10.

In this embodiment, in order to perform alignment of the alignment marks, the relative position of the mask M relative to the projection optical system 3 (lens barrel 13) in the horizontal direction (XY-plane direction) can also be changed, for example, in cooperation with the alignment controller 22. Further, in order to perform focus control in cooperation with the focus controller 23, it is also possible to change the relative distance of the mask M relative to the projection optical system 3 (lens barrel 13) in the optical axis direction (Z direction).

In addition, the functional blocks that execute various types of control regarding exposure are established in the control device 12, though not illustrated. Further, in order to implement the functional blocks, dedicated hardware such as an integrated circuit (IC) may be appropriately used.

When the alignment of the mask M and the workpiece W, the focus control, and the change in the relative position of the mask M relative to the projection optical system 3 (lens barrel 13) are completed, the exposure step for the workpiece W is started, and the exposure light EL is emitted from the light-emission unit 2. The workpiece W coated with a resist is irradiated with the exposure light EL, which is emitted from the light-emission unit 2, through the mask M on which the mask pattern MP is formed and the projection optical system 3. Thus, the mask pattern MP is projected onto the workpiece W and exposed.

Figure 2:
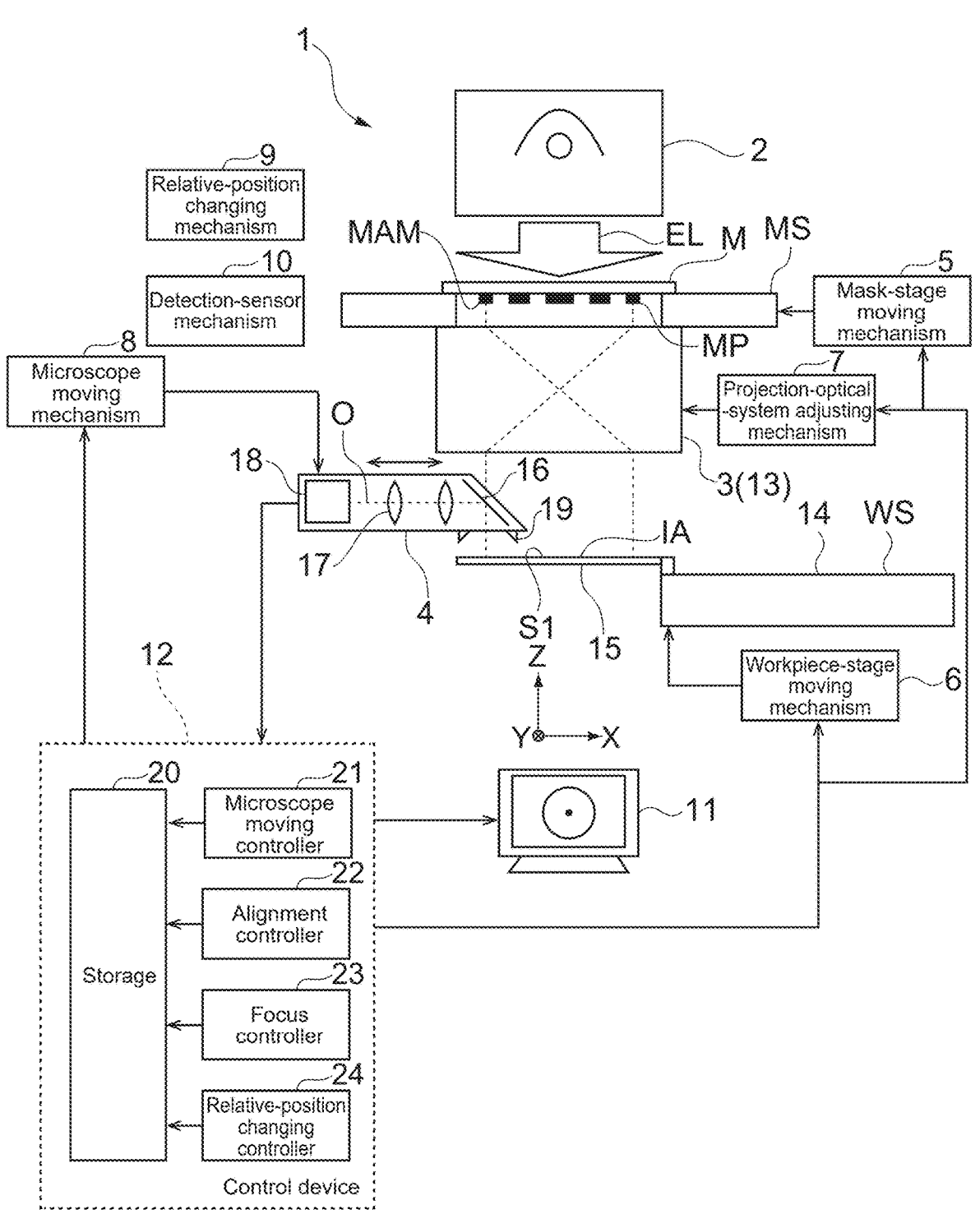
FIG. 2 is a schematic diagram for describing an operation example of detecting an alignment mark using an alignment microscope (step of detecting mask mark)
Figure 3:
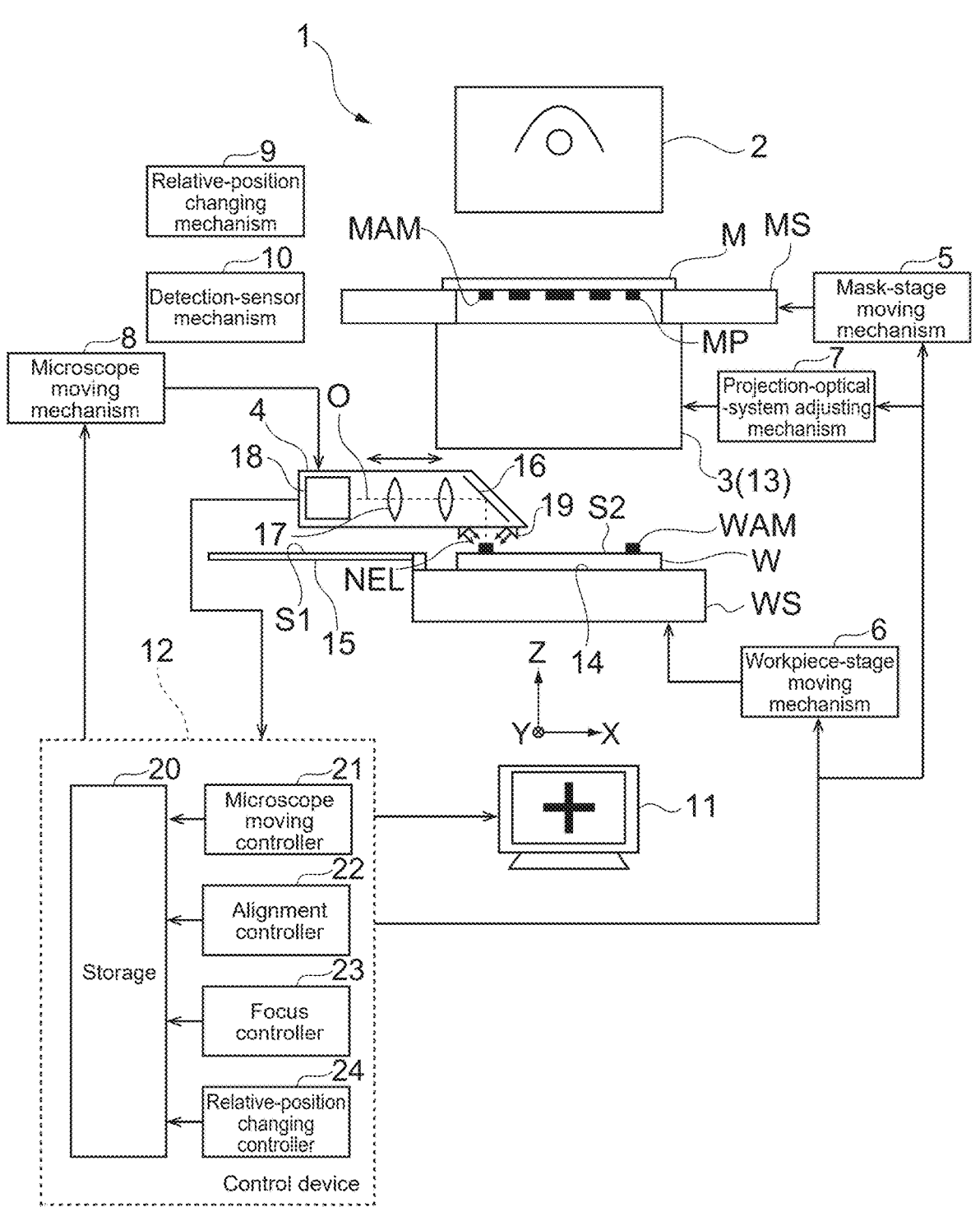
FIG. 3 is a schematic diagram for describing an operation example of detecting an alignment mark using the alignment microscope (step of detecting workpiece mark)

FIGS. 2 and 3 are schematic diagrams for describing an operation example of detecting an alignment mark (mask mark MAM/workpiece mark WAM) using the alignment microscope 4. FIG. 2 is a schematic diagram showing the step of detecting the mask mark MAM. FIG. 3 is a schematic diagram showing the step of detecting the workpiece mark WAM.

First, as shown in FIG. 2, the mask M is disposed on the mask stage MS. For example, the control device 12 drives a robot arm or the like (illustration omitted) such that the mask M is disposed at a reference position before alignment. As a matter of course, the mask M may be disposed by an operator.

Further, in the step of detecting the mask mark MAM, the reflective member 15 is moved to the irradiation region IA from a position outside the irradiation region IA for the exposure light EL with which the projection optical system 3 is irradiated.

In this embodiment, when the workpiece-stage moving mechanism 6 is driven, the workpiece stage WS is moved such that the placement surface 14 is moved outside the irradiation region IA for the exposure light EL, and thus the reflective member 15 is moved to the irradiation region IA for the exposure light EL. The reflective member 15 is connected to a position different from the placement surface 14 of the workpiece stage WS. The workpiece-stage moving mechanism 6 moves the workpiece stage WS and thus moves the reflective member 15 to the irradiation region IA for the exposure light EL.

As shown in FIG. 2, the alignment microscope 4 is moved to an imaging position of the alignment mark. The imaging position of the alignment mark is set between the projection optical system 3 and the workpiece stage WS (workpiece W).

The imaging position of the alignment mark is set to be a position at which the beam splitter 16 of the alignment microscope 4 is disposed in the optical path of the exposure light EL with which the mask mark MAM is irradiated. In other words, the imaging position of the alignment mark is set to be a position at which the exposure light EL with which the mask mark MAM is irradiated enters the beam splitter 16 of the alignment microscope 4.

As shown in FIG. 2, in this embodiment, the beam splitter 16 is disposed at an intersection angle of 45 degrees relative to the optical path of the exposure light EL, the optical path extending in the vertical direction (Z direction). Specifically, the beam splitter 16 is disposed so as to be parallel to a direction of a slant angle of 45 degrees from the upper left to the lower right.

When the exposure light EL is emitted from the light-emission unit 2, the exposure light EL with which the mask mark MAM is irradiated enters the beam splitter 16 from the upper side through the projection optical system 3. The exposure light EL passing through the beam splitter 16 and traveling toward the lower side is reflected toward the upper side by the reflective member 15.

The exposure light EL reflected toward the upper side is reflected by the beam splitter 16, travels toward the left side along the horizontal direction (X direction), and enters the optical sensor 18. Thus, an image of the mask mark MAM is captured by the optical sensor 18.

As described above, in this embodiment, the alignment microscope 4 is disposed in the optical path of the exposure light EL with which the mask mark MAM is irradiated, and the image of the mask mark MAM is captured on the basis of the reflected light reflected by the reflective member 15.

The alignment controller 22 of the control device 12 detects the position of the mask mark MAM on the basis of the image of the mask mark MAM captured by the optical sensor 18 of the alignment microscope 4. Further, the alignment controller 22 can also take in the image of the mask mark MAM captured by the optical sensor 18, and cause the monitor 11 to display the image. An operator can confirm the detection of the mask mark MAM by visually recognizing the image of the mask mark MAM displayed on the monitor 11.

In this embodiment, the alignment controller 22 detects coordinates of the central position of the mask mark MAM as a position of the mask mark MAM. In the example shown in FIG. 2, a circular mask mark MAM is detected, and the coordinates of the central position thereof are calculated. As a matter of course, the shape of the mask mark MAM, and a position of the mask mark MAM to be calculated as the position of the mask mark MAM are not limited and may be discretionally set.

In order to detect the position of the mask mark MAM, for example, any image recognition technology such as image size conversion, character recognition, shape recognition, matching processing using a model image of an object, edge detection, or projection transformation may be used. Further, any machine learning algorithm using, for example, a deep neural network (DNN), a recurrent neural network (RNN), or a convolutional neural network (CNN) may be used. Note that a machine learning algorithm may be applied to any processing in the present disclosure.

The image of the mask mark MAM acquired by the alignment controller 22, and the position of the mask mark MAM detected by the alignment controller 22 (coordinates of central position) are stored in the storage 20.

As shown in FIG. 3, the emission of the exposure light EL by the light-emission unit 2 is stopped in the step of detecting the workpiece mark WAM. The workpiece W is then placed on the placement surface 14 of the workpiece stage WS. The workpiece stage WS is moved such that the workpiece W is disposed on the lower side of the projection optical system 3.

For example, the control device 12 drives a robot arm or the like (illustration omitted) such that the workpiece W is disposed on the placement surface 14. As a matter of course, the workpiece W may be disposed by the operator.

The alignment microscope 4 is not moved and remains disposed at the imaging position of the alignment mark. The illumination unit 19 of the alignment microscope 4 then irradiates the workpiece mark WAM with the non-exposure light NEL. The non-exposure light NEL with which the workpiece mark WAM is irradiated is reflected by the workpiece mark WAM and enters the beam splitter 16 disposed on the upper side of the workpiece mark WAM.

The non-exposure light NEL that is incident on the beam splitter 16 is reflected, travels toward the left side along the horizontal direction (X direction), and enters the optical sensor 18. Thus, an image of the workpiece mark WAM is captured by the optical sensor 18.

The alignment controller 22 of the control device 12 detects the position of the workpiece mark WAM on the basis of the image of the workpiece mark WAM captured by the optical sensor 18 of the alignment microscope 4. Further, the alignment controller 22 can also take in the image of the workpiece mark WAM captured by the optical sensor 18, and cause the monitor 11 to display the image. Thus, the operator can confirm the detection of the workpiece mark WAM by visually recognizing the image of the workpiece mark WAM displayed on the monitor 11.

As shown in FIG. 3, in this embodiment, coordinates of the central position of the workpiece mark WAM having a cross shape are calculated as a position of the workpiece mark WAM. As a matter of course, the shape of the workpiece mark WAM, and a position of the workpiece mark WAM to be detected as the position of the workpiece mark WAM are not limited and may be discretionally set. For example, the workpiece mark WAM may be configured with the same shape as that of the mask mark MAM.

The image of the workpiece mark WAM acquired by the alignment controller 22, and the position of the workpiece mark WAM detected by the alignment controller 22 (coordinates of central position) are stored in the storage 20.

The alignment controller 22 controls the workpiece stage WS such that the positional relationship between the mask mark MAM and the workpiece mark WAM is a predetermined positional relationship. In this embodiment, the mask-stage moving mechanism 5 and the workpiece-stage moving mechanism 6 are driven such that the position of the mask mark MAM (coordinates of central position) and the position of the workpiece mark WAM (coordinates of central position) coincide with each other, and a relative position of the workpiece W relative to the mask M is controlled.

In order that the relative-position changing controller 24 operates in cooperation with the alignment controller 22 to control the relative position of the workpiece W relative to the mask M, the relative position of the mask M relative to the projection optical system 3 (lens barrel 13) in the horizontal direction (XY-plane direction) may be changed.

FIGS. 1 to 3 show only the single alignment microscope 4 disposed for a set of the mask mark MAM and the workpiece mark WAM corresponding to each other. If a plurality of sets of the mask mark MAM and the workpiece mark WAM are formed, alignment is performed using the alignment microscopes 4 for the plurality of sets of the mask mark MAM and the workpiece mark WAM corresponding to each other.

For example, a single alignment microscope 4 is disposed for each set of the mask mark MAM and the workpiece mark WAM corresponding to each other, and an image of the mask mark MAM and an image of the workpiece mark WAM are captured. The present invention is not limited to the above, and an image of the mask mark MAM and an image of the workpiece mark WAM may be sequentially captured by a smaller number of alignment microscopes 4, e.g., one alignment microscope 4, than the number of sets of the mask mark MAM and the workpiece mark WAM.

For example, the mask marks MAM are formed at four corners of the rectangular mask M, and the workpiece marks WAM are formed at four corners of the workpiece W formed of a rectangular substrate. In this case, four alignment microscopes 4 are respectively disposed at imaging positions of the alignment marks, the imaging positions being a position in the optical path of the exposure light EL with which the mask mark MAM is irradiated and a position in the optical path of the non-exposure light NEL with which the workpiece mark WAM corresponding to the mask mark MAM is irradiated.

The alignment controller 22 of the control device 12 detects the positions of the four mask marks MAM and the positions of the four workpiece marks WAM. The mask-stage moving mechanism 5 and the workpiece-stage moving mechanism 6 are then controlled such that the four sets of the mask mark MAM and the workpiece mark WAM corresponding to each other respectively have predetermined positional relationships. The relative-position changing mechanism 9 may be controlled in cooperation with the mask-stage moving mechanism 5 and the workpiece-stage moving mechanism 6. This makes it possible to perform alignment of the mask M and the workpiece W in the rotation directions with the horizontal direction (X direction), the depth direction (Y direction), and the vertical direction (Z direction) being used as rotation-axis directions.

When the alignment of the mask M and the workpiece W is completed, the alignment microscope 4 is retracted to the retracted position shown in FIG. 1. As a matter of course, the alignment microscope 4 may be retracted to the retracted position at other timings such as a timing at which the capturing of the image of the mask mark MAM and the image of the workpiece mark WAM is completed, and a timing at which the detection of the position of the mask mark MAM and the position of the workpiece mark WAM by the alignment controller 22 is completed.

In such a manner, in this embodiment, in the step of detecting the mask mark MAM, the reflective member 15 having a size equal to or larger than the size of the irradiation region IA is disposed in the irradiation region IA for the exposure light EL. This makes it possible to perform alignment with high accuracy even when an alignment mark (mask mark MAM/workpiece mark WAM) is disposed at any position of the exposure surface (irradiation region IA).

In other words, the alignment microscope 4 is appropriately moved to a position at which the mask mark MAM is projected onto the reflective member 15. This makes it possible to capture the images of the mask mark MAM and the workpiece mark WAM and to align the alignment marks. As a result, it is possible to perform alignment of various masks M and workpieces W with high accuracy.

In the exposure apparatus disclosed in Japanese Patent Application Laid-open No. Hei 08-233529, a reflective member is embedded in the substantially entire surface of a workpiece stage. In other words, the reflective member is provided in the entire placement surface of the workpiece stage. The step of detecting a mask mark is performed in a state in which the workpiece is not disposed and the reflective member is exposed upward.

In the configuration in which the reflective member is embedded in the placement surface of the workpiece stage, there is a high possibility that the function of suctioning the workpiece placed on the placement surface is limited. For example, there is a high possibility that the configuration of a suction mechanism, such as the number of vacuum-suction holes and the positions thereof, is limited such that the imaging of the mask mark is not affected in the step of detecting the mask mark. Further, it is inherently difficult to form a vacuum-suction hole for vacuum suction in a reflective member formed of a mirror member or the like.

If the configuration of the suction mechanism is limited as descried above, as the size of the reflective member increases, a portion capable of suctioning the workpiece decreases. As a result, a thin workpiece such as a printed-circuit board or a wafer (e.g., workpiece having a thickness of 0.05 mm or less) fails to be vacuum-suctioned (fixed) satisfactorily, and the exposure accuracy deteriorates due to deterioration in flatness of the workpiece, alignment accuracy of the workpiece, and the like. Further, the accuracy of detecting the mask mark MAM by the alignment microscope is also lowered.

Further, in a transparent workpiece having light-transmitting property, multiple reflection of the exposure light transmitted through the workpiece during the exposure step may occur by the reflective member provided in the placement surface. In this case, unnecessary exposure or the like of the resist occurs, and thus the exposure accuracy is lowered. Further, the imaging accuracy of the workpiece mark may be lowered due to the multiple reflection in the step of detecting the workpiece mark.

Furthermore, in the configuration in which the reflective member is embedded in the placement surface of the workpiece stage, in the step of detecting the workpiece mark, the placement surface (reflective member) for the workpiece is located directly under the projection optical system, and the exposure light is to be radiated thereto. Therefore, it is impossible to replace the workpiece with another one to be disposed on the placement surface during the step of detecting the mask mark.

As a result, it is necessary to sequentially perform the step of stopping the emission of the exposure light from the light-emission unit and then placing a workpiece on the placement surface (reflective member) after the step of detecting the mask mark, resulting in low productivity.

Further, in the configuration in which the reflective member is embedded in the placement surface of the workpiece stage, the height position of the upper surface of the reflective member and the height position of the upper surface of the workpiece cannot be made equal to each other. Therefore, in the step of detecting the mask mark, it is necessary to move the workpiece stage upward by the thickness of the workpiece to adjust the focus of the image of the mask mark projected onto the reflective member. As a result, a motion stroke corresponding to the thickness of the workpiece needs to be accurate. If a positional deviation occurs when the workpiece is moved upward, the alignment accuracy of the alignment mark is lowered.

In the exposure apparatus 1 according to this embodiment, the reflective member 15 is provided at a position other than the placement surface 14 of the workpiece stage WS. The placement surface 14 is moved so as to be deviated from the irradiation region IA for the exposure light EL, and the reflective member 15 is moved to the irradiation region IA for the exposure light EL.

As a result, it is possible to form a suction mechanism capable of satisfactorily vacuum-suctioning the workpiece W onto the placement surface 14. For example, it is possible to achieve a configuration in which the vacuum-suction holes are formed evenly over the entire region of the placement surface 14, and the workpiece W is suctioned over the entire surface of the placement surface 14.

This makes it possible to sufficiently fix and hold a thin workpiece W and to prevent a decrease in flatness and alignment accuracy of the workpiece W. Further, for a transparent workpiece W, multiple reflection of the exposure light EL transmitted through the workpiece W can be prevented. As a result, for various workpieces W, high exposure accuracy can be exhibited and a workpiece-handling performance can be highly exhibited.

Further, in the exposure apparatus 1 according to this embodiment, in the step of detecting the mask mark MAM, the placement surface 14 of the workpiece stage WS is moved to a position deviated from the irradiation region IA for the exposure light EL. Therefore, the workpiece W can be replaced at the same time in the step of detecting the mask mark MAM. As a result, the throughput can be improved and a takt time can be shortened, so that high productivity can be exhibited.

Further, in the exposure apparatus 1 according to this embodiment, as shown in FIG. 1 or the like, the reflective member 15 can be connected to the workpiece stage WS such that the height position of the upper surface S1 of the reflective member 15 and the height position of the surface S2 of the workpiece W are equal to each other.

Therefore, when the workpiece stage WS is moved in the horizontal direction (XY-plane direction), the reflective member 15 can be disposed in the irradiation region IA such that the height position of the surface S1 of the reflective member 15 is equal to the height position of the surface S2 of the workpiece W held by the workpiece stage WS.

As a result, for example, in the step of detecting the mask mark MAM, it is possible to eliminate the need to move the workpiece stage WS upward by the thickness of the workpiece W and possible to perform alignment of the alignment marks with high accuracy.

Further, in the step of detecting the mask mark MAM, even when the workpiece stage WS is moved along the vertical direction (Z direction) in order to make the height position of the surface S1 of the reflective member 15 coincide with the height position of the surface S2 of the workpiece W with high accuracy, a smaller amount of adjustment (amount of movement) suffices. This makes it possible to perform alignment of the alignment marks with less errors caused by the movement and with high accuracy.

As described above, in the exposure apparatus 1 according to this embodiment, in the step of detecting the mask mark MAM, the reflective member 15 is moved from the position deviated from the irradiation region IA for the exposure light EL to the irradiation region IA. This makes it possible to improve accuracy in alignment between the mask M and the workpiece W and achieve high exposure accuracy.

Applying the present technology makes it possible to achieve alignment of any alignment marks in the exposure surface (irradiation region IA) while maintaining high flatness, productivity, and exposure accuracy of the workpiece W.

Figure 4:
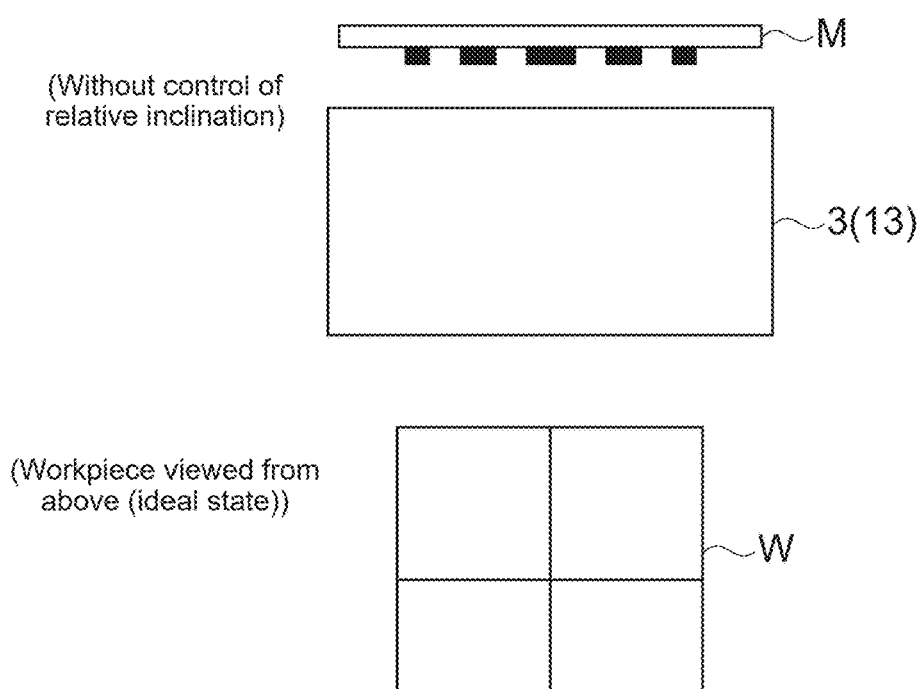
FIG. 4 is a schematic diagram for describing a relative inclination of a mask relative to a projection optical system (lens barrel)
Figure 5:
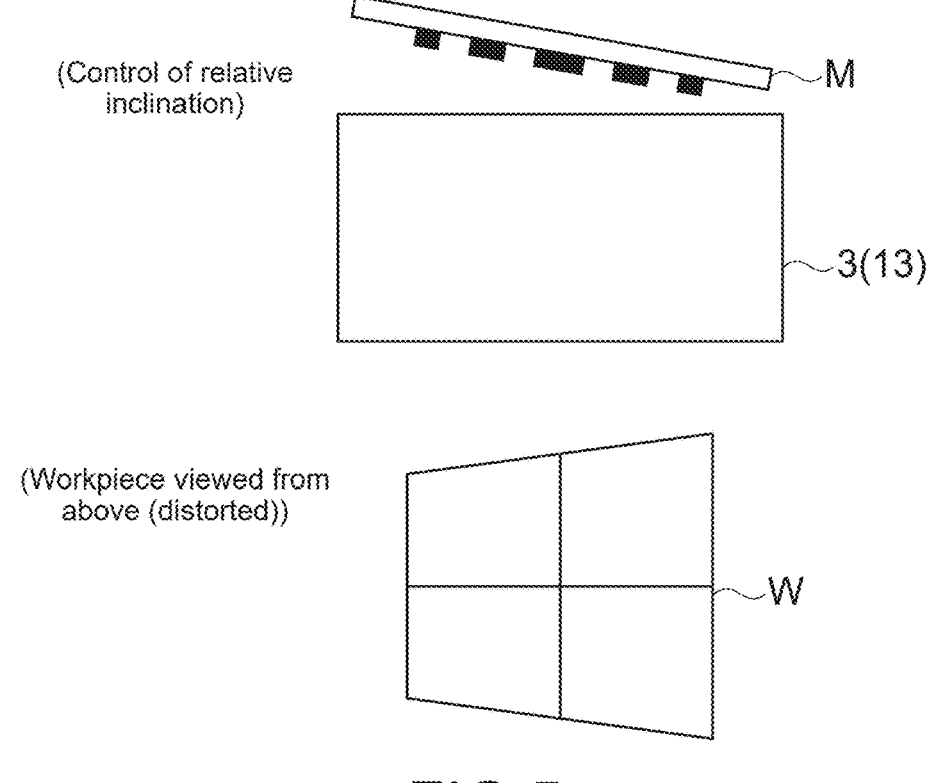
FIG. 5 is a schematic diagram for describing a relative inclination of the mask relative to the projection optical system (lens barrel)

FIGS. 4 and 5 are schematic diagrams for describing the relative inclination (relative angle) of the mask M relative to the projection optical system 3 (lens barrel 13).

As seen from the comparison between FIGS. 4 and 5, when the workpiece W placed on the workpiece stage WS is viewed from above, a small distortion may occur in the shape of the workpiece W due to a small deformation of the workpiece W caused by heat or the like, a dimension error of the workpiece W, a small inclination of the workpiece stage WS, and the like. Note that generated distortions are emphasized in FIGS. 4 and 5 for the purpose of easy understanding of the description.

As shown in FIG. 4, if the workpiece W is placed ideally and no distortions are generated, the exposure step can be performed with high accuracy without relatively inclining the mask M relative to the projection optical system 3 (lens barrel 13).

As shown in FIG. 5, if a distortion is generated in the shape of the workpiece W, the mask M is relatively inclined relative to the projection optical system 3 (lens barrel 13), and the image of the mask pattern MP is deformed (distorted) according to the shape of the workpiece W. This makes it possible to perform the exposure step with high accuracy.

For example, if the exposure apparatus 1 is configured as a step-and-repeat exposure apparatus (stepping projection aligner) for a printed-circuit board, distortions in the substrate vary widely. Therefore, distortions in the substrate per shot (per shot region) also vary widely. For such workpieces W having wide variations in distortions in the substrate, the image of the mask pattern MP is suitably distorted per shot, and the exposure step can be performed with high accuracy.

In the exposure apparatus 1 according to this embodiment, when the relative-position changing mechanism 9 is driven, it is possible to control the relative inclination of the mask M relative to the projection optical system 3 (lens barrel 13) and to achieve high exposure accuracy even if the shape of the workpiece W is distorted.

Further, in this embodiment, a detection result by the detection-sensor mechanism 10 is fed back, so that the relative inclination of the mask M relative to the projection optical system 3 (lens barrel 13) can be controlled with high accuracy. Therefore, it is possible to sufficiently cope with the small distortion or the like of the shape of the workpiece W and to further improve the exposure accuracy.

As a matter of course, it is also possible to highly accurately control the relative position of the mask M relative to the projection optical system 3 (lens barrel 13) in the horizontal direction (XY-plane direction) and the relative distance of the mask M relative to the projection optical system 3 (lens barrel 13) in the optical axis direction (Z direction). As a result, for example, it is also possible to improve the accuracy in alignment of the mask M and the workpiece W, focus control, or the like and to achieve high exposure accuracy.

[Configuration Example of Relative-Position Changing Mechanism]

Figure 6:
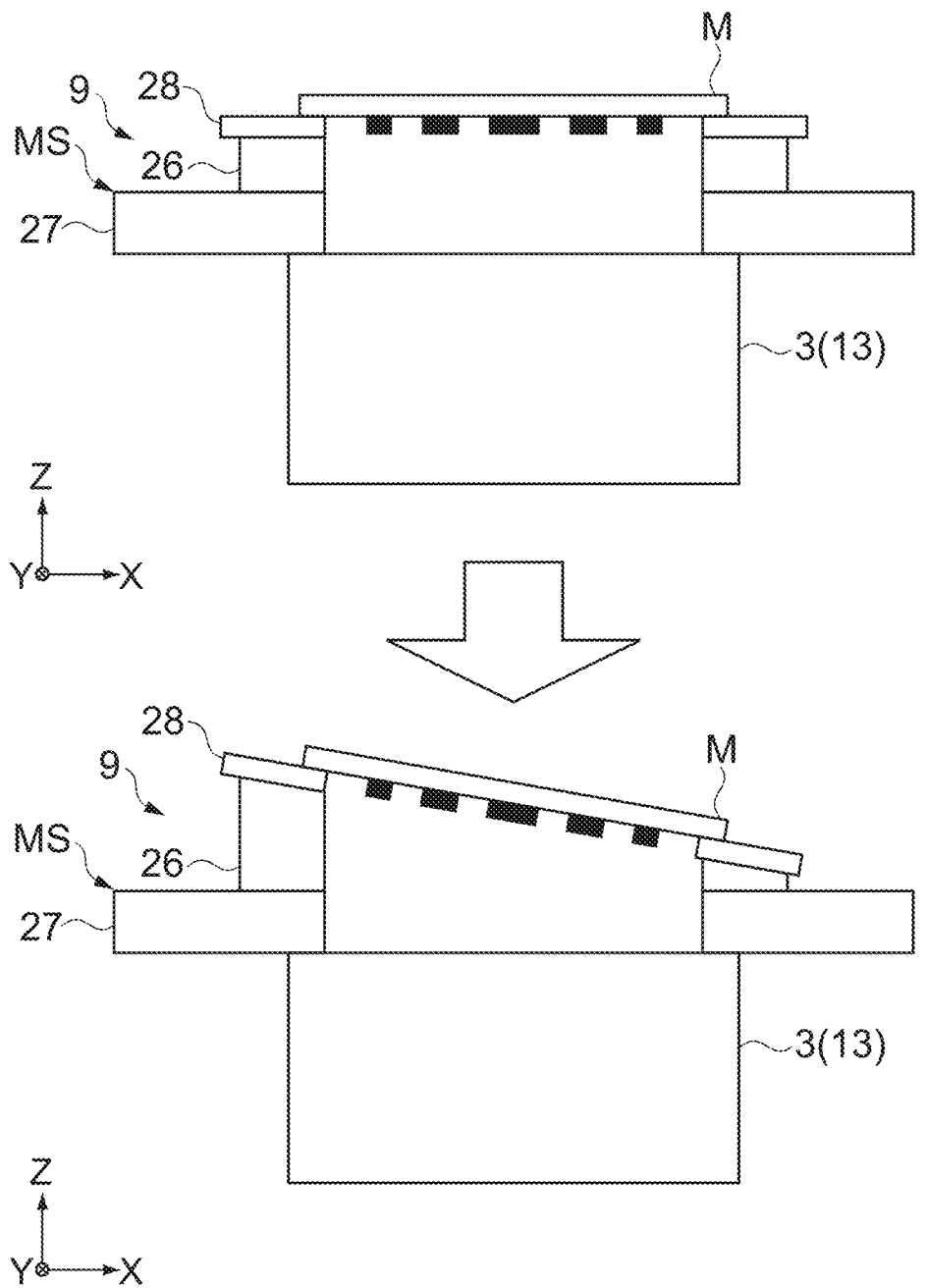
FIG. 6 is a schematic diagram showing a configuration example of a relative-position changing mechanism.

FIG. 6 is a schematic diagram showing a configuration example of the relative-position changing mechanism 9. In the example shown in FIG. 6, the relative-position changing mechanism 9 includes a mask-side moving mechanism 26 that changes at least one of the relative position or the relative angle of the mask M relative to the mask stage MS.

As shown in FIG. 6, the mask stage MS includes a connection member 27 connected to the lens barrel 13, and a mask-holding member 28 that holds the mask M. In this embodiment, the connection member 27 is fixed to the lens barrel 13.

The connection member 27 and the mask-holding member 28 include openings, through which the exposure light EL passes, formed at the central portions thereof so as not to hinder the irradiation with the exposure light EL.

The mask-side moving mechanism 26 is configured to be capable of changing at least one of a relative position or a relative angle of the mask-holding member 28 relative to the connection member 27 fixed to the lens barrel 13. In this embodiment, the mask-side moving mechanism 26 is configured to be capable of changing a relative distance of the mask-holding member 28 relative to the connection member 27 in the optical axis direction (Z direction), a relative position of the mask-holding member 28 relative to the connection member 27 in the horizontal direction (XY-plane direction), and a relative inclination of the mask-holding member 28 relative to the connection member 27. In other words, in this embodiment, it is possible to change both the relative position and the relative angle of the mask-holding member 28 relative to the connection member 27.

When the mask-side moving mechanism 26 is driven, it is possible to change the relative position and the relative angle of the mask M relative to the projection optical system 3 (lens barrel 13).

A specific configuration of the mask-side moving mechanism 26 is not limited. Any configuration may be employed on the condition that the exposure light EL emitted from the light-emission unit 2 is not prevented from passing through the mask M and entering the projection optical system 3.

For example, any moving mechanism using a linear guide mechanism such as a rail, a gear mechanism, a bearing mechanism, or the like may be configured as the mask-side moving mechanism 26. Further, any actuator mechanism using a piezo actuator, a servo motor, a stepping motor, a linear actuator, a linear motor, an elastic member, or the like may be used.

For example, a flat stage that is movable relative to the connection member 27 along each of the horizontal direction (X direction) and the depth direction (Y direction) and is rotatable with the vertical direction (Z direction) being used as a rotation-axis direction is configured so as not to hinder the irradiation with the exposure light EL. An actuator that can be displaced along the vertical direction (Z direction) is then disposed between the flat stage and the mask-holding member 28 so as to abut on the mask-holding member 28.

As viewed from above along the vertical direction (Z direction), the flat stage is configured to surround the irradiation region irradiated with the exposure light EL. Further, a plurality of driving points are set in the circumference of the mask-holding member 28, and a plurality of actuators are installed so as to be capable of displacing the height positions of the plurality of driving points in the vertical direction (Z direction).

Driving the flat stage makes it possible to change the relative position of the mask-holding member 28 relative to the connection member 27 in the horizontal direction (XY-plane direction). Further, driving each of the plurality of actuators in the vertical direction (Z direction) by the same amount of displacement makes it possible to change the relative distance of the mask-holding member 28 relative to the connection member 27 in the optical axis direction (Z direction).

Furthermore, appropriately adjusting the amount of displacement in each of the plurality of actuators makes it possible to change the relative inclination of the mask-holding member 28 relative to the connection member 27 as illustrated in FIG. 6.

In addition, any configuration capable of changing the relative position and the relative angle of the mask M relative to the mask stage MS may be employed as the mask-side moving mechanism 26.

Figure 7:
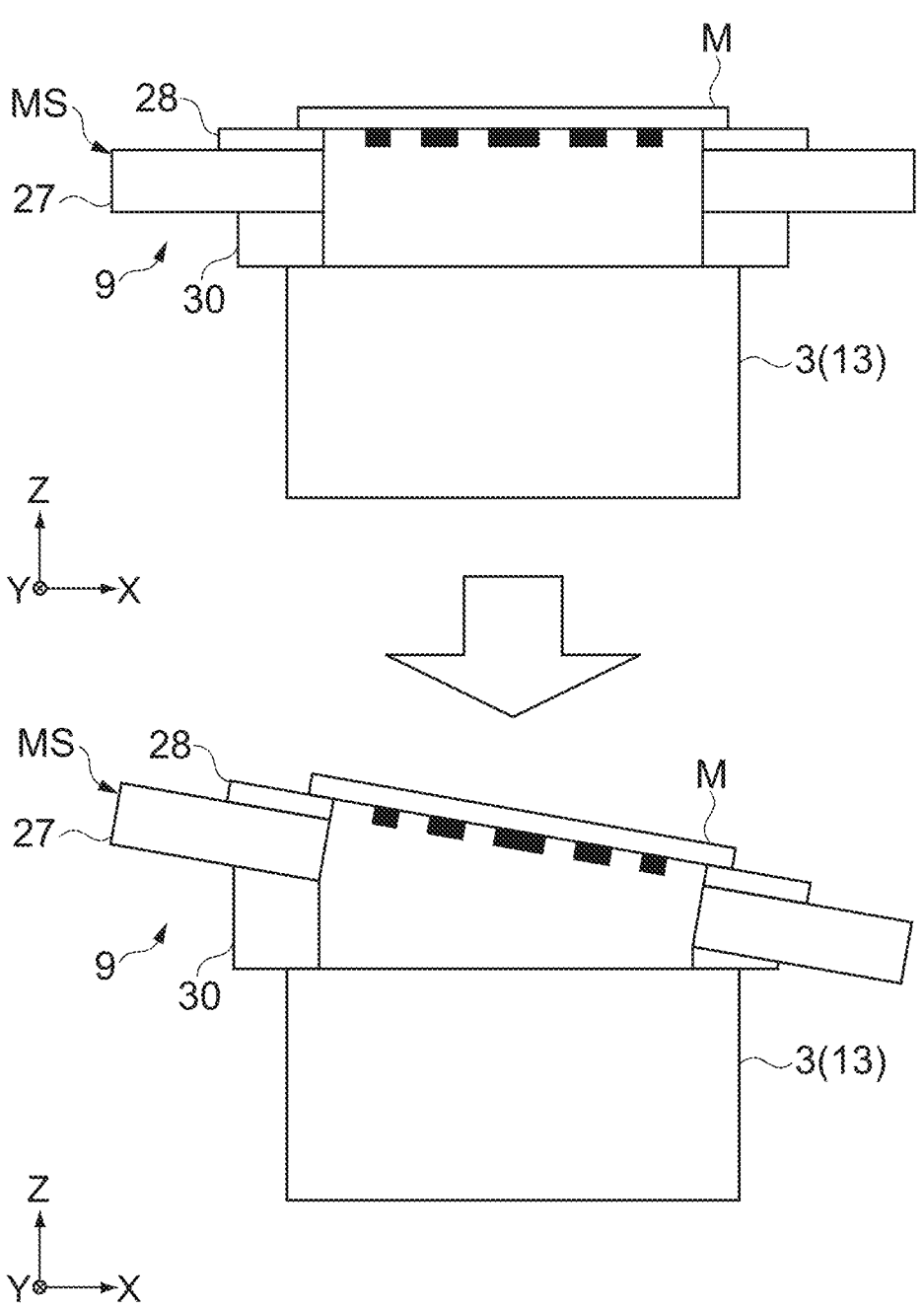
FIG. 7 is a schematic diagram showing another configuration example of the relative-position changing mechanism.

FIG. 7 is a schematic diagram showing another configuration example of the relative-position changing mechanism 9. In the example shown in FIG. 7, the relative-position changing mechanism 9 includes a stage-side moving mechanism 30 that changes at least one of the relative position or the relative angle of the mask stage MS relative to the lens barrel 13.

As shown in FIG. 7, the mask stage MS includes a connection member 27 connected to the lens barrel 13, and a mask-holding member 28 that holds the mask M. In this embodiment, the connection member 27 is movably connected to the lens barrel 13 via the stage-side moving mechanism 30.

The connection member 27 and the mask-holding member 28 include openings, through which the exposure light EL passes, formed at the central portions thereof so as not to hinder the irradiation with the exposure light EL.

The stage-side moving mechanism 30 is configured to be capable of changing at least one of a relative position or a relative angle of the connection member 27 relative to the lens barrel 13. In this embodiment, the stage-side moving mechanism 30 is configured to be capable of changing a relative distance of the connection member 27 relative to the lens barrel 13 in the optical axis direction (Z direction), a relative position of the connection member 27 relative to the lens barrel 13 in the horizontal direction (XY-plane direction), and a relative inclination of the connection member 27 relative to the lens barrel 13. In other words, in this embodiment, it is possible to change both the relative position and the relative angle of the connection member 27 relative to the lens barrel 13.

When the stage-side moving mechanism 30 is driven, it is possible to change at least one of the relative position or the relative angle of the mask M relative to the projection optical system 3 (lens barrel 13).

A specific configuration of the stage-side moving mechanism 30 is not limited. Any configuration may be employed on the condition that the exposure light EL emitted from the light-emission unit 2 is not prevented from passing through the mask M and entering the projection optical system 3.

For example, any moving mechanism using a linear guide mechanism such as a rail, a gear mechanism, a bearing mechanism, or the like may be configured as the stage-side moving mechanism 30. Further, any actuator mechanism using a piezo actuator, a servo motor, a stepping motor, a linear actuator, a linear motor, an elastic member, or the like may be used.

For example, a base (base substrate) and a flat stage are configured as the stage-side moving mechanism 30. The base (base substrate) is fixed to the lens barrel 13. The flat stage is installed on the base, and is movable along each of the horizontal direction (X direction) and the depth direction (Y direction) and rotatable with the vertical direction (Z direction) being used as a rotation-axis direction. The base and the flat stage include openings formed at the central portions thereof so as not to hinder the irradiation with the exposure light EL.

Further, an actuator that can be displaced along the vertical direction (Z direction) is disposed between the flat stage and the connection member 27 of the mask stage MS so as to abut on the connection member 27.

As viewed from above along the vertical direction (Z direction), the flat stage is configured to surround the irradiation region irradiated with the exposure light EL. Further, a plurality of driving points are set in the circumference of the connection member 27, and a plurality of actuators are installed so as to be capable of displacing the height positions of the plurality of driving points in the vertical direction (Z direction).

Driving the flat stage makes it possible to change the relative position of the connection member 27 relative to the lens barrel 13 in the horizontal direction (XY-plane direction). Further, driving each of the plurality of actuators in the vertical direction (Z direction) by the same amount of displacement makes it possible to change the relative distance of the connection member 27 relative to the lens barrel 13 in the optical axis direction (Z direction).

Furthermore, appropriately adjusting the amount of displacement in each of the plurality of actuators makes it possible to change a relative inclination of the connection member 27 relative to the lens barrel 13 as illustrated in FIG. 7.

In addition, any configuration capable of changing the relative position and the relative angle of the mask stage MS relative to the lens barrel 13 may be employed as the stage-side moving mechanism 30.

If the mask-holding member 28 is fixed to the connection member 27 as in the example shown in FIG. 7, it is also possible to regard a member including both the connection member 27 and the mask-holding member 28 as a member functioning as the connection member 27 and also functioning as the mask-holding member 28.

The mask-side moving mechanism 26 illustrated in FIG. 6 and the stage-side moving mechanism 30 illustrated in FIG. 7 may be configured together. For example, the relative position of the mask M relative to the projection optical system 3 (lens barrel 13) in the horizontal direction (XY-plane direction) and the relative distance therebetween in the optical axis direction (Z direction) are changed by changing the relative position of the connection member 27 relative to the lens barrel 13 by the stage-side moving mechanism 30. The relative inclination of the mask M relative to the projection optical system 3 (lens barrel 13) is changed by changing the relative angle of the mask-holding member 28 relative to the connection member 27 by the mask-side moving mechanism 26. Such a configuration may be employed.

Alternatively, in order to change the relative inclination of the mask M relative to the projection optical system 3 (lens barrel 13), the change in the relative inclination of the connection member 27 relative to the lens barrel 13 by the stage-side moving mechanism 30 and the change in the relative inclination of the mask-holding member 28 relative to the connection member 27 by the mask-side moving mechanism 26 may be performed in cooperation with each other.

[Configuration Example of Detection-Sensor Mechanism]

FIGS. 8 to 11 are schematic diagrams each showing a configuration example of the detection-sensor mechanism 10. The detection-sensor mechanism 10 includes one or more detection sensors that can detect at least one of a position or an angle of an object to be detected. For example, a sensor that can detect a distance, an inclination, or the like of an object to be detected can be used as the detection sensor. Hereinafter, description will be given on information regarding a position and an angle (any information with which a position and an angle can be detected), which will be referred to as position and angle information.

For example, any sensor that can detect the position and angle information including a distance, an inclination, or the like, such as a laser interferometer, an autocollimator, an oblique-incidence laser position detector, a contact position detector, a magnetic sensor, or an optical sensor, may be used as the detection sensor. Alternatively, an imaging device (imaging unit) that can capture a two-dimensional image may be used as the detection sensor.

Figure 8:
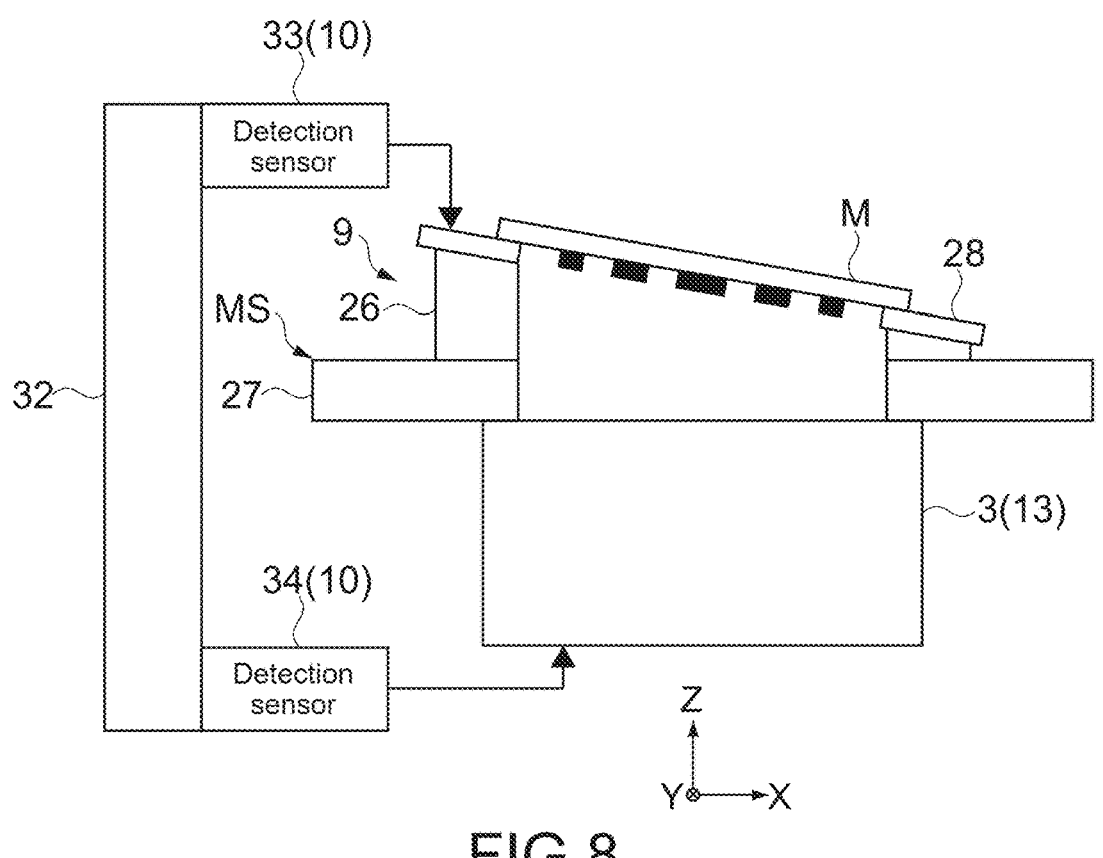
FIG. 8 is a schematic diagram showing a configuration example of a detection-sensor mechanism.

In the example shown in FIG. 8, the mask-side moving mechanism 26 shown in FIG. 6 is configured as the relative-position changing mechanism 9. In the example shown in FIG. 9, the stage-side moving mechanism 30 shown in FIG. 7 is configured as the relative-position changing mechanism 9.

Figure 9:
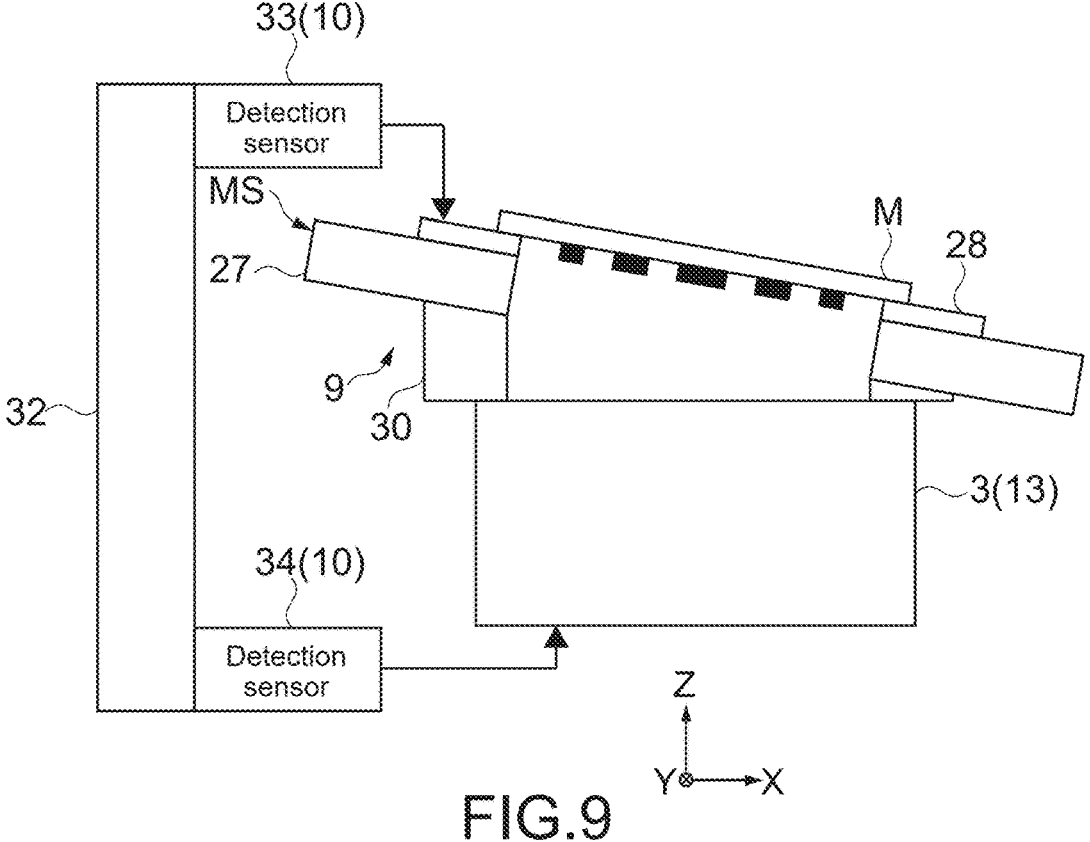
FIG. 9 is a schematic diagram showing another configuration example of the detection-sensor mechanism.

In the examples shown in FIGS. 8 and 9, a detection sensor 33 that sets the mask-holding member 28 as an object to be detected, and a detection sensor 34 that sets the lens barrel 13 as an object to be detected are each provided, as the detection-sensor mechanism 10, to a frame member 32 of the exposure apparatus 1.

On the basis of the position and angle information of the mask-holding member 28 detected by the detection sensor 33 and the position and angle information of the lens barrel 13 detected by the detection sensor 34, it is possible to detect at least one of the relative position or the relative angle of the mask M relative to the projection optical system 3 (lens barrel 13). A specific algorithm for detecting at least one of the relative position or the relative angle of the mask M relative to the projection optical system 3 (lens barrel 13) is not limited, and any algorithm may be used.

Note that the detection sensor 33 may be installed with the mask M being used as an object to be detected. In this case as well, it is possible to detect at least one of the relative position or the relative angle of the mask M relative to the projection optical system 3 (lens barrel 13) on the basis of the position and angle information of the mask M detected by the detection sensor 33 and the position and angle information of the lens barrel 13 detected by the detection sensor 34.

Hereinafter, the detection sensor 33 that sets the mask M or the mask-holding member 28 as an object to be detected will be referred to as a mask-side detection sensor 33 by using the same reference numeral. Further, the detection sensor 34 that sets the lens barrel 13 as an object to be detected will be referred to as an optical-system-side detection sensor 34 by using the same reference numeral.

For example, as viewed from the vertical direction (Z direction), a plurality of points to be detected are set in the circumference of the mask-holding member 28 or the mask M. A plurality of mask-side detection sensors 33 are disposed on the frame member 32 so as to be capable of respectively detecting the position and angle information of the points to be detected.

Further, a plurality of points to be detected are set on the lens barrel 13. A plurality of optical-system-side detection sensors 34 are disposed on the frame member 32 so as to be capable of respectively detecting the position and angle information of the points to be detected. On the basis of the detection results of the plurality of mask-side detection sensors 33 and the detection results of the plurality of optical-system-side detection sensors 34, at least one of the relative position or the relative angle of the mask M relative to the projection optical system 3 (lens barrel 13) can be detected.

Note that a specific configuration for installing the mask-side detection sensor 33 and the optical-system-side detection sensor 34, a specific configuration for setting the points to be detected, and the like may be discretionally designed. For example, an object to be detected may be formed on the detected mask-holding member 28, the mask M, or the lens barrel 13 so as to set a point to be detected.

An object to be detected such as a protrusion may be formed on the mask-holding member 28, the mask M, or the lens barrel 13 to detect the position and angle information of the object to be detected. For example, an object to be detected may be provided as a target that is to be irradiated with laser light of a laser interferometer.

Figure 10:
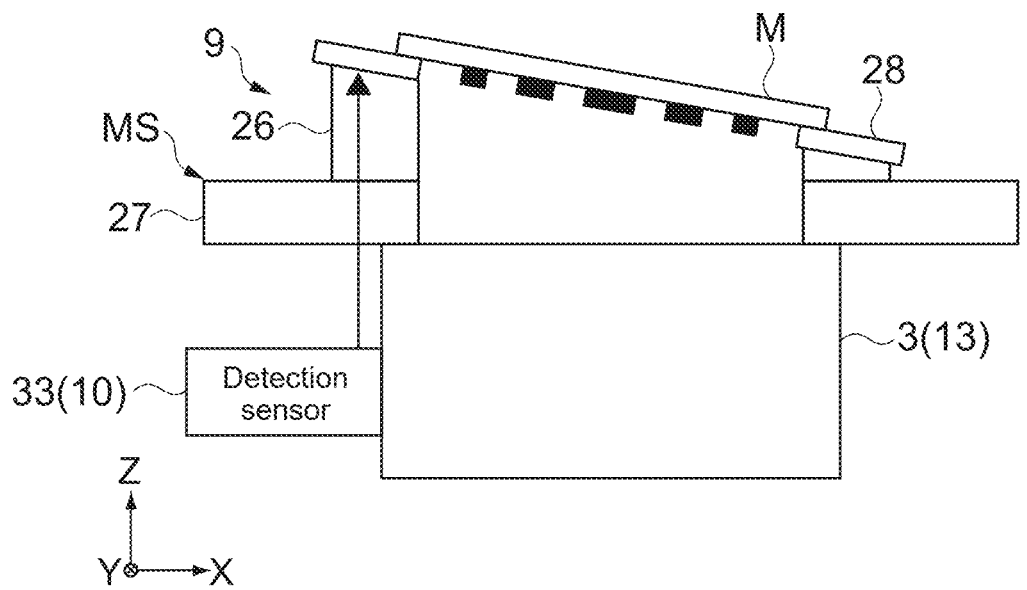
FIG. 10 is a schematic diagram showing another configuration example of the detection-sensor mechanism.
Figure 11:
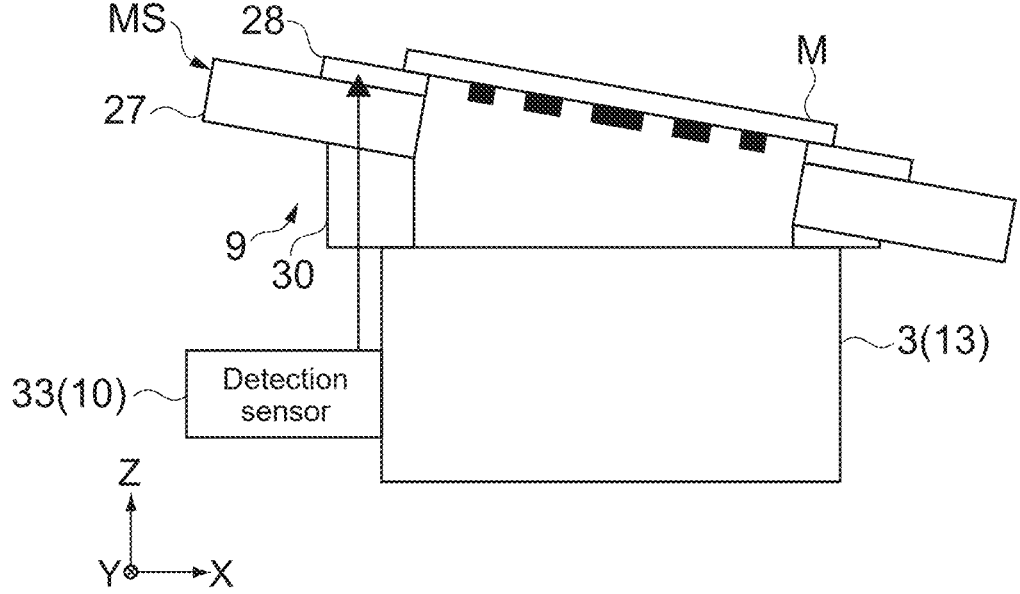
FIG. 11 is a schematic diagram showing another configuration example of the detection-sensor mechanism.

FIGS. 10 and 11 are schematic diagrams showing other configuration examples of the detection-sensor mechanism 10. In the example shown in FIG. 10, the mask-side moving mechanism 26 shown in FIG. 6 is configured as the relative-position changing mechanism 9. In the example shown in FIG. 11, the stage-side moving mechanism 30 shown in FIG. 7 is configured as the relative-position changing mechanism 9.

In the examples shown in FIGS. 10 and 11, the mask-side detection sensor 33 that sets the mask-holding member 28 as an object to be detected is fixed to the lens barrel 13. Thus, the position and angle information of the mask-holding member 28 detected by the mask-side detection sensor 33 is information indicating at least one of the relative position or the relative angle relative to the lens barrel 13. Therefore, it is possible to detect at least one of the relative position or the relative angle of the mask M relative to the projection optical system 3 (lens barrel 13) on the basis of the detection result of the mask-side detection sensor 33. In other words, this eliminates the need to provide the optical-system-side detection sensor 34 that sets the lens barrel 13 as an object to be detected and makes it possible to achieve a simplified apparatus configuration, a reduction in size of the apparatus, and suppression of component costs.

As a matter of course, the mask-side detection sensor 33 that sets the mask M as an object to be detected may be fixed to the lens barrel 13.

The optical-system-side detection sensor 34 that sets the lens barrel 13 as an object to be detected may be fixed to the mask-holding member 28. Thus, the position and angle information of the lens barrel 13 detected by the optical-system-side detection sensor 34 is information indicating at least one of the relative position or the relative angle relative to the mask-holding member 28. Therefore, it is possible to detect at least one of the relative position or the relative angle of the mask M relative to the projection optical system 3 (lens barrel 13) on the basis of the detection result of the optical-system-side detection sensor 34. In other words, this eliminates the need to provide the mask-side detection sensor 33 that sets the mask M or the mask-holding member 28 as an object to be detected and makes it possible to achieve a simplified apparatus configuration, a reduction in size of the apparatus, and suppression of component costs.

Note that a specific configuration for fixing the mask-side detection sensor 33 to the lens barrel 13 may be discretionally designed. Further, a specific configuration for detecting the position and angle information of the mask-holding member 28 by the mask-side detection sensor 33 fixed to the lens barrel 13 may be discretionally designed. For example, if a laser interferometer, an autocollimator, or the like is used as the mask-side detection sensor 33, appropriately forming a through-hole, a recess, or the like for causing the laser light to pass therethrough makes it possible to detect the position and angle information of the mask-holding member 28.

Also in the case where the optical-system-side detection sensor 34 is fixed to the mask-holding member 28, a specific configuration for fixing the optical-system-side detection sensor 34 to the mask-holding member 28 is not limited and may be discretionally designed. Further, a specific configuration for detecting the position and angle information of the lens barrel 13 by the optical-system-side detection sensor 34 fixed to the mask-holding member 28 may be discretionally designed.

Figure 12:
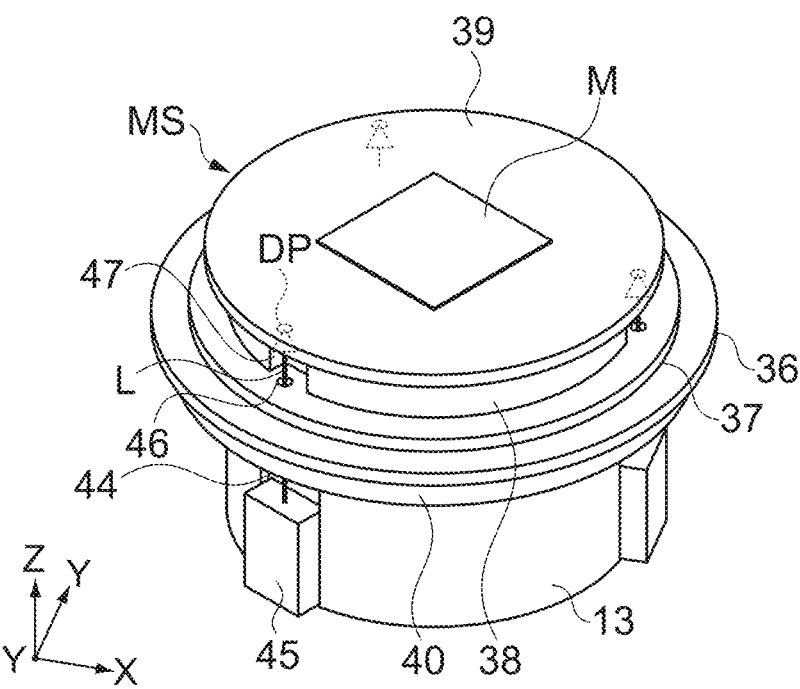
FIG. 12 is a schematic view showing a specific configuration example of a mask stage and a lens barrel.
Figure 13:
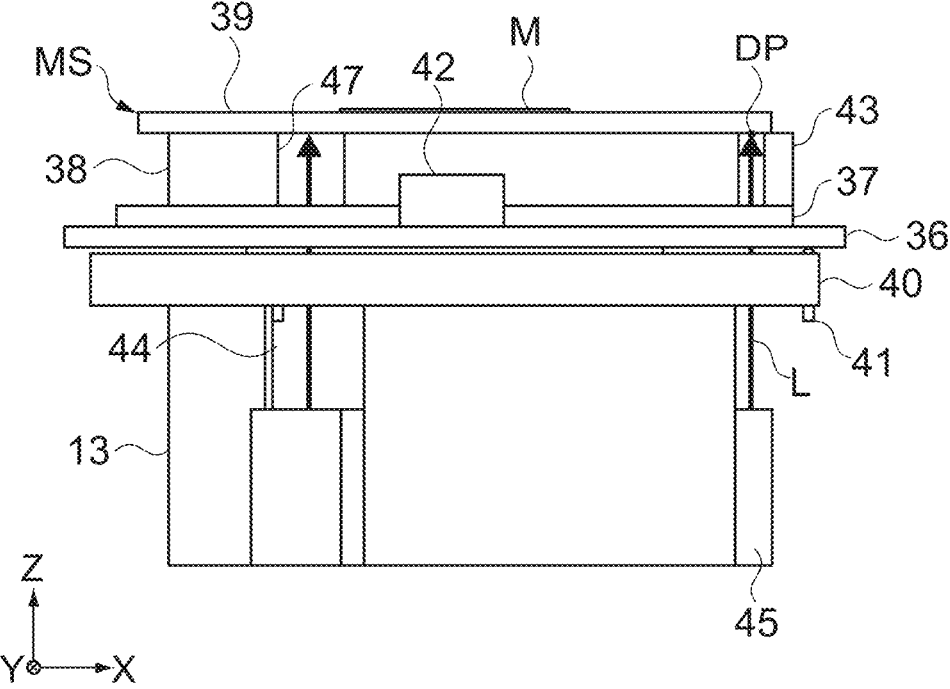
FIG. 13 is a schematic view showing a specific configuration example of the mask stage and the lens barrel.

FIGS. 12 and 13 are schematic views showing a specific configuration example of the mask stage MS and the lens barrel 13. FIG. 12 is a perspective view of the mask stage MS and the like as viewed from obliquely above. FIG. 13 is a front view of the mask stage MS and the like as viewed from the front. Note that the configuration example shown in FIGS. 12 and 13 can also be a specific example of the configuration shown in FIG. 10.

In the example shown in FIGS. 12 and 13, the mask stage MS includes a base member 36, a flat stage 37, a guide support member 38, and a mask-holding member 39.

The base member 36 is connected and fixed to a coupling member 40 provided at an upper end portion of the lens barrel 13. In this embodiment, the base member 36 is connected to the coupling member 40 of the lens barrel 13 through plungers 41. Three plungers 41 are disposed at three locations at regular intervals of an angle of 120° as viewed from above in the vertical direction (Z direction), and the coupling member 40 and the base member 36 are connected to each other.

The configuration for connecting the coupling member 40 of the lens barrel 13 and the base member 36 of the mask stage MS to each other is not limited, and thread fastening or the like may be employed. Meanwhile, if the three-point support configuration using the plungers 41 is employed as in this embodiment, it is possible to suppress the influence of thermal expansion and it is advantageous to improve the exposure accuracy.

The flat stage 37 is configured to be movable relative to the base member 36 along each of the horizontal direction (X direction) and the depth direction (Y direction) and to be rotatable with the vertical direction (Z direction) being used as a rotation-axis direction.

The guide support member 38 is disposed on the flat stage 37 and supports the mask-holding member 39. If the flat stage 37 is moved and rotated, the guide support member 38 and the mask-holding member 39 are integrally moved according to the motion of the flat stage 37. Thus, a relative position of the mask-holding member 39 relative to the base member 36 in the horizontal direction (XY-plane direction) is changed.

The guide support member 38 supports the mask-holding member 39 such that the mask-holding member 39 can be moved and inclined in the optical axis direction (Z direction). Therefore, when a force acts on the mask-holding member 39 toward the upper side and the lower side along the optical axis direction (Z direction), a relative distance of the mask-holding member 39 relative to the base member 36 in the optical axis direction (Z direction) is changed.

Further, when a force acts on the mask-holding member 39 so as to incline the mask-holding member 39, a relative inclination of the mask-holding member 39 relative to the base member 36 is changed.

The mask-holding member 39 holds the mask M. As shown in FIG. 12, in this embodiment, points to be detected DP are set on the lower surface on the lower side of the mask-holding member 39. As viewed along the vertical direction (Z direction), the points to be detected DP are set at three locations at regular intervals of an angle of 120° in the circumference of the mask-holding member 39.

As shown in FIG. 13, the base member 36 is provided with a plane-direction actuator 42 for moving and rotating the flat stage 37 in the horizontal direction (XY-plane direction). A specific configuration of the plane-direction actuator 42 is not limited and any configuration may be employed. Note that the illustration of the plane-direction actuator 42 is omitted in FIG. 12.

Further, as shown in FIG. 13, vertical actuators 43 are disposed between the flat stage 37 and the mask-holding member 39. The vertical actuators 43 are disposed in the vicinity of three points to be detected DP1 to DP3 and can move the mask-holding member 39 along the vertical direction (Z direction) with the portions abutting on the mask-holding member 39 being used as driving points. The three vertical actuators 43 are disposed at regular intervals of an angle of 120° as viewed from above.

A specific configuration of the vertical actuators 43 is not limited and any configuration may be employed. Note that the illustration of the three vertical actuators 43 is omitted in FIG. 12. Further, FIG. 13 also shows only the vertical actuator 43 disposed in the vicinity of the point to be detected DP located at a right end in the figure, and the illustration of the vertical actuators 43 disposed in the vicinity of the other points to be detected DP is omitted.

When the three vertical actuators 43 are driven, a relative distance of the mask-holding member 39 relative to the base member 36 in the optical axis direction (Z direction) and a relative inclination of the mask-holding member 39 relative to the base member 36 are changed.

Three mounting recesses 44 are formed on the side surface of the lens barrel 13 so as to extend along the vertical direction (Z direction). The three mounting recesses 44 are respectively formed at the lower positions of the three points to be detected DP.

Three laser interferometers 45 are mounted in the three mounting recesses 44. The laser interferometers 45 are installed facing upward along the vertical direction (Z direction). In other words, the laser interferometers 45 are mounted in the mounting recesses 44 such that the laser light L is radiated upward.

Further, the laser interferometers 45 are mounted such that the laser light L is emitted toward the points to be detected DP set on the mask-holding member 39. The distance and the angle of the mask-holding member 39 are detected on the basis of the detection results of the points to be detected DP obtained by the three laser interferometers 45. In other words, distance measurement and inclination measurement (angle measurement) for the mask-holding member 39 are performed on the basis of the detection results obtained by the three laser interferometers 45.

As shown in FIG. 12, in order to allow the distance measurement for the point to be detected DP to be performed, a through-hole 46 through which the laser light L passes is formed in the flat stage 37. Similarly, through-holes are formed also in the base member 36 and the coupling member 40 of the lens barrel 13. Further, a recess 47 is formed in the guide support member 38 so as to ensure a space for performing detection for the point to be detected DP.

The materials of the coupling member 40 of the lens barrel 13 and of the base member 36, the flat stage 37, and the mask-holding member 39 of the mask stage MS are not limited. For example, a ceramic material, a metallic material, or the like may be appropriately used.

In the example shown in FIGS. 12 and 13, the base member 36 and the mask-holding member 39 respectively correspond to the connection member 27 and the mask-holding member 28 shown in FIG. 10. The flat stage 37, the guide support member 38, the plane-direction actuator 42, and the vertical actuators 43 function as the mask-side moving mechanism 26 shown in FIG. 10. In this embodiment, the mask stage MS is configured including the mask-side moving mechanism 26. In other words, the mask-side moving mechanism 26 also functions as a part of the mask stage MS.

Note that the stage-side moving mechanism 30 shown in FIGS. 9 and 11 may also be configured as a part of the mask stage MS and connected to the lens barrel 13. Alternatively, the stage-side moving mechanism 30 may also be configured as a part of the lens barrel 13 and connected to the mask stage MS.

In the example shown in FIGS. 12 and 13, the three laser interferometers 45 each correspond to the mask-side detection sensor 33 fixed to the lens barrel 13 shown in FIG. 10. Further, the three laser interferometers 45 correspond to one embodiment of three mask-side detection sensors according to the present invention, which set three different positions of the exposure mask or the mask-holding member as objects to be detected, and also correspond to one embodiment of three mask-side detection sensors that are fixed to the holding member with the three different positions of the exposure mask or the mask-holding member being used as objects to be detected.

Figure 16:
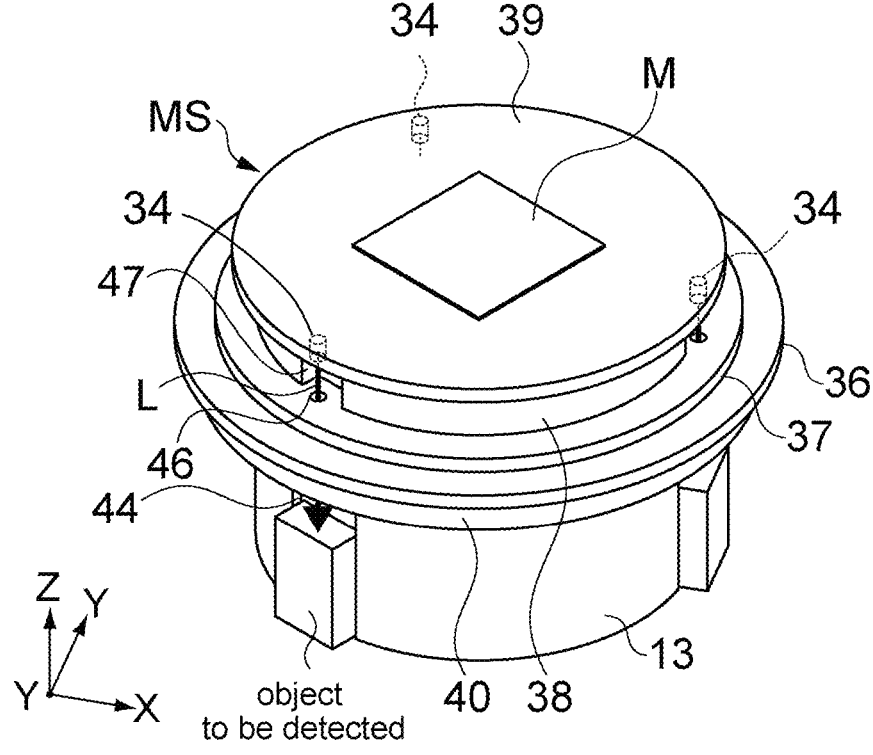
FIG. 16 is a schematic view showing a specific configuration example of a mask stage and a lens barrel.

Three laser interferometers may be disposed facing downward at positions of the three points to be detected DP shown in FIGS. 12 and 13, as shown in FIG. 16. Objects to be detected may be disposed at the locations of the three laser interferometers 45 shown in FIGS. 12 and 13, and points to be detected DP may be set on the upper surfaces of the objects to be detected.

In such a configuration as well, it is possible to perform distance measurement and inclination measurement (angle measurement) for the lens barrel 13 on the basis of the detection results obtained by the three laser interferometers 45. When such a configuration is employed, the three laser interferometers correspond to one embodiment of three optical-system-side detection sensors according to the present invention, which set three different positions of the holding member as objects to be detected, and also correspond to one embodiment of three optical-system-side detection sensors that are fixed to the mask-holding member with the different three positions of the holding member being used as the objects to be detected.

Figure 14:
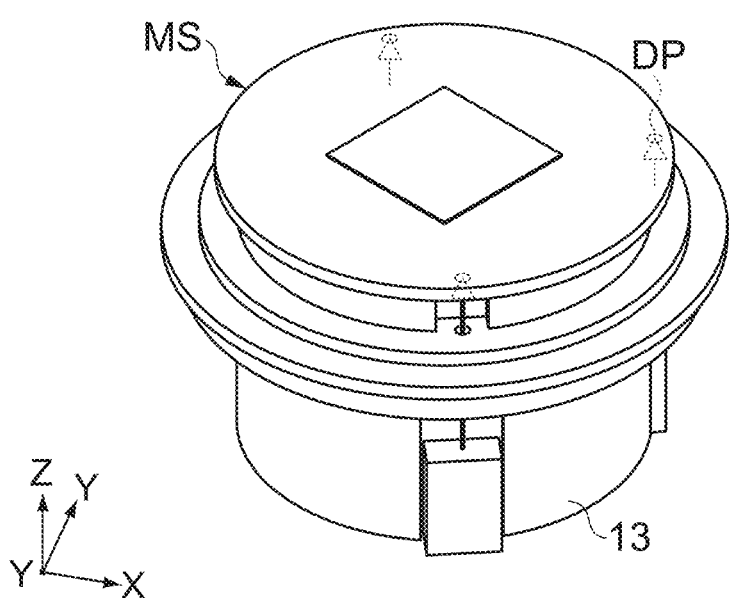
FIG. 14 is a schematic view showing another configuration example of the mask stage and the lens barrel.
Figure 15:
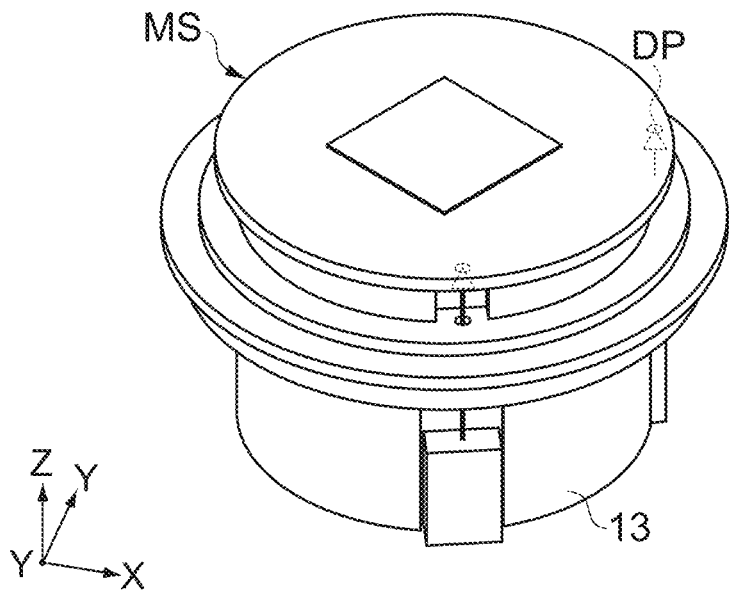
FIG. 15 is a schematic view showing another configuration example of the mask stage and the lens barrel.

FIGS. 14 and 15 are schematic views showing another configuration example of the mask stage MS and the lens barrel 13. In the example shown in FIG. 14, as viewed from the vertical direction (Z direction), three points to be detected DP are set at positions different from the positions at regular intervals of an angle of 120°. In the example shown in FIG. 15, two points to be detected DP are set on the lower surface of the mask-holding member 39. In such a manner, the number of points to be detected DP, the positions thereof, and the like are not limited and may be discretionally set.

Further, the type of the detection sensor disposed as the mask-side detection sensor 33 is also not limited and can be optimized according to a parameter to be measured, accuracy, cost, and the like. For example, if it is desired to detect only the angle (inclination) of the mask-holding member 39, this is achieved by setting one point to be detected DP and arranging one autocollimator for the point to be detected DP.

If it is desired to perform distance measurement and angle measurement for the mask-holding member 39, at least two points to be detected DP are necessary to be provided. Two laser interferometers are disposed or one laser interferometer and one autocollimator are disposed for the two points to be detected DP. Such a configuration makes it possible to achieve both the distance measurement and the angle measurement. To achieve an improvement in detection accuracy of the relative position, the configuration of setting the three points to be detected DP as shown in FIG. 12 or the like is advantageous.

If a contact position detector that can perform distance measurement for the point to be detected DP is used, the position detector only needs to be disposed such that a measuring element of the position detector extends toward the point to be detected DP along the vertical direction (Z direction) and comes into contact with the point to be detected DP. For example, the position detector only needs to be disposed such that the measuring element is disposed at a position corresponding to the laser light L coming from the laser interferometer 45 shown in FIGS. 12 and 15. As a matter of course, another configuration may be employed.

Further, in the example shown in FIGS. 12 to 15, the point to be detected DP is set on the lower surface of the mask-holding member 39. The present invention is not limited to the above. For example, a through-hole may be formed at a position of the point to be detected DP of the mask-holding member 39, and an object to be detected may be disposed so as to occlude the through-hole. In this case, the lower surface of the object to be detected becomes the point to be detected DP, and the position and angle information of the mask-holding member 39 can be detected at a position close to the upper surface of the mask-holding member 39 that holds the mask M.

As a matter of course, it may also be possible to enlarge the size of an outer region formed outside the region in which the mask pattern MP of the mask M is formed, and to set the point to be detected DP in the outer region. This makes it possible to directly detect the position and angle information of the mask M. Alternatively, a detection sensor may be disposed in the outer region of the mask M.

Hereinabove, in the exposure apparatus 1 according to this embodiment, the lens barrel 13 that holds the projection optical system 3 is connected to the mask stage MS. Further, the relative-position changing mechanism 9 changes at least one of the relative position or the relative angle of the mask M relative to the projection optical system 3 (lens barrel 13). Further, the detection-sensor mechanism 10 detects at least one of the relative position or the relative angle. This makes it possible to achieve high exposure accuracy.

In a projection aligner including a projection optical system, exposure light radiated to a mask is radiated to a workpiece through the projection optical system, and a mask pattern is transferred to a workpiece. Therefore, a relative position and a relative angle of the mask relative to the projection optical system are important for exposure performance.

In the exposure apparatus 1 according to this embodiment, the mask stage MS is connected to the lens barrel 13. This makes it possible to stably change a relative position and a relative angle of the mask M relative to the projection optical system 3 (lens barrel 13) as compared with the case where the lens barrel 13 and the workpiece stage MS are separately configured. Further, it is also advantageous to shorten a settling time after the relative position and the relative angle are changed. As a result, the exposure accuracy can be improved.

Further, if a space between the mask M and the projection optical system 3 is large, it is necessary to increase a numerical aperture in order to increase the resolution of the projection optical system 3, and it is necessary to provide the projection optical system 3 with a large diameter in order to increase the numerical aperture. As a result, it becomes difficult to manufacture lenses, and it may become a factor of an increase in size of the apparatus. From this viewpoint, a configuration unique to the present invention in which the mask stage MS is connected to the lens barrel 13 can be an advantageous configuration.

It is assumed that a configuration in which the detection sensor is disposed on the frame member 32 as shown in FIGS. 8 and 9 is employed in the arrangement configuration of one or more detection sensors (mask-side detection sensor 33 and optical-system-side detection sensor 34) constituting the detection-sensor mechanism 10. In this configuration, when the frame member 32 is distorted due to the influence of heat or the like, there is a possibility that the detection accuracy of the relative position and the relative angle is lowered.

Further, when the casing of the exposure apparatus 1 vibrates, the frame member 32 supported by the casing also vibrates. Due to the vibration of the frame member 32, both of the detection accuracy of the position and angle information of the mask-holding member 28 (mask M) by the mask-side detection sensor 33 and the detection accuracy of the position and angle information of the lens barrel 13 by the optical-system-side detection sensor 34 may decrease. In this case, the detection accuracy of the relative position and the relative angle also decreases. Further, since a measured value is not stable until the vibration of the frame member 32 subsides, the settling performance is poor and the settling time is long.

Meanwhile, if the configuration in which the mask-side detection sensor 33 is fixed to the lens barrel 13 as shown in FIGS. 10 to 15 is employed, a decrease in detection accuracy due to a distortion or the like of the frame member 32 is prevented.

Further, even if the casing of the exposure apparatus 1 vibrates, the mask-side detection sensor 33 is fixed to the lens barrel 13 and the position and angle information of the mask-holding member 39 is directly detected, and thus the influence on the detection accuracy of the relative position and the relative angle can be reduced to a large extent as compared with the configuration in which the detection sensor is disposed on the frame member 32. In other words, in the configuration in which the mask-side detection sensor 33 is fixed to the lens barrel 13 as shown in FIGS. 10 to 15, it is possible to sufficiently suppress the influence of disturbance such as vibration. As a result, the settling performance is increased, and the settling time can be shortened.

Further, in the configuration in which the mask-side detection sensor 33 is fixed to the lens barrel 13 as shown in FIGS. 10 to 15, it is possible to reduce a space necessary for mounting the detection sensor such as a laser interferometer or an autocollimator as compared with the case where the detection sensor is disposed on the frame member 32. It is advantageous to achieve a simplified apparatus configuration and a reduction in size of the apparatus.

An advantageous effect exhibited by the configuration in which the mask-side detection sensor 33 is fixed to the lens barrel 13 as shown in FIGS. 10 to 15 is similarly exhibited when the optical-system-side detection sensor 34 is fixed to the mask-holding member 39, as shown in FIG. 16.

Other Embodiments

The present invention is not limited to the embodiment described above and can implement various other embodiments.

A configuration in which only the relative inclination of the mask M relative to the projection optical system 3 (lens barrel 13) can be changed may be employed as the relative-position changing mechanism 9, and deformation of the image of the mask pattern M in accordance with the state of the workpiece as illustrated in FIG. 4 may be performed. In this case, a configuration in which only the relative inclination of the mask M relative to the projection optical system 3 (lens barrel 13) can be detected may be employed as the detection-sensor mechanism 10.

Adopting the configuration of changing and detecting only the relative inclination makes it possible to achieve a simplified apparatus configuration, a reduction in size of the apparatus, and a reduction in component costs as compared with the configuration in which the relative distance in the optical axis direction (Z direction) or the relative position in the horizontal direction (XY-plane direction) can be further changed and detected. Conversely, parameters that can be changed and detected may be appropriately selected according to specifications, costs, and the like.

A corner cube may be configured in a portion at which the point to be detected DP is set. This makes it possible to return measurement light such as laser light in the same direction even if the posture changes, and also possible to reduce the influence of vibration and the like.

In the example shown in FIG. 12 or the like, the three laser interferometers 45 are disposed at the same height position in the vertical direction (Z direction). The present invention is not limited to the above. It is possible to arrange the detection sensor at a free position relative to the point to be detected DP.

Both a detection sensor fixed to the lens barrel or the mask-holding member and a detection sensor disposed on the frame member may be used. At least one detection sensor of the one or more detection sensors constituting the detection-sensor mechanism is fixed to the lens barrel or the mask-holding member. Thus, the above effects of the detection sensor can be exerted.

An optical fiber sensor may be fixed to the lens barrel or the mask-holding member, and detection light for detecting the position and angle information of the mask-holding member or the mask may be emitted from the optical fiber sensor. Such a configuration is also included in the configuration in which the detection sensor is fixed to the lens barrel or the mask-holding member.

A temperature sensor or an atmospheric pressure sensor may be mounted to the lens barrel or the mask-holding member. This makes it possible to perform calibration in consideration of the influence of thermal expansion, atmospheric pressure fluctuation, and the like, and it is possible to achieve detection of a relative position and a relative angle with high accuracy.

Use of the exposure apparatus according to the present invention to perform exposure makes it possible to manufacture various substrates, on which predetermined patterns are formed, as components. For example, an electric circuit element, an optical element, a micro electro mechanical systems (MEMS), a recording element, a sensor, a mold, or the like can be manufactured as a component.

Examples of the electric circuit element include volatile or non-volatile semiconductor memories such as a dynamic random access memory (DRAM), a static random access memory (SRAM), a flash memory, and a magnetoresistive random access memory (MRAM), and semiconductor elements such as a large scale integration (LSI), a charge-coupled device (CCD), an image sensor, and a field-programmable gate array (FPGA). Examples of the mold include a mold for imprinting.

The configurations of the exposure apparatus, the control device, the alignment microscope, the moving mechanisms, the adjustment mechanism, the relative-position changing mechanism, the detection-sensor mechanism, the beam splitter, the optical sensor, and the like, the alignment method, the relative-position changing method, the relative-position detecting method, the exposure method, and the like described above with reference to the respective figures are merely embodiments and can be discretionally modified without departing from the gist of the present invention. In other words, any other configurations, processing flows, algorithms, and the like for the purpose of practicing the present invention may be employed.

In the present disclosure, to easily understand the description, the words such as "substantially", "approximately", and "about" are appropriately used. Meanwhile, it does not define a clear difference between the case where those words such as "substantially", "approximately", and "about" are used and the case where those words are not used.

In other words, in the present disclosure, concepts defining shapes, sizes, positional relationships, states, and the like, such as "central", "middle", "uniform", "equal", "same", "orthogonal", "parallel", "symmetric", "extended", "axial", "columnar", "cylindrical", "ring-shaped", and "annular", are concepts including "substantially central", "substantially middle", "substantially uniform", "substantially equal", "substantially the same", "substantially orthogonal", "substantially parallel", "substantially symmetric", "substantially extended", "substantially axial", "substantially columnar", "substantially cylindrical", "substantially ring-shaped", "substantially annular", and the like.

For example, the states included in a predetermined range (e.g., range of ±10%) with reference to "completely central", "completely middle", "completely uniform", "completely equal", "completely the same", "completely orthogonal", "completely parallel", "completely symmetric", "completely extended", "completely axial", "completely columnar", "completely cylindrical", "completely ring-shaped", "completely annular", and the like are also included.

Therefore, even if the words such as "substantially", "approximately", and "about" are not added, the concept that is expressed by adding so-called "substantially", "approximately", "about", and the like thereto can be included. To the contrary, the complete states are not necessarily excluded from the states expressed by adding "substantially", "approximately", "about", and the like.

In the present disclosure, expressions using the term "than" such as "larger than A" and "smaller than A" are expressions that comprehensively include concepts that include the case of being equal to A and concepts that do not include the case of being equal to A. For example, "larger than A" is not limited to the case where it does not include "equal to A"; however, it also includes "equal to or larger than A". Further, "smaller than A" is not limited to "less than A"; it also includes "equal to or smaller than A".

Upon implementation of the present technology, specific settings and other settings may be appropriately employed from the concepts that are included in "larger than A" and "smaller than A" to achieve the effects described above.

At least two of the features among the features described above according to the present technology can also be combined. In other words, various features described in the respective embodiments may be combined discretionarily regardless of the embodiments. Further, the various effects described above are merely illustrative and not restrictive, and other effects may be exerted.

It should be understood by those skilled in the art that various modifications, combinations, sub-combinations and alterations may occur depending on design requirements and other factors insofar as they are within the scope of the appended claims or the equivalents thereof.

What is claimed is:

1. An exposure apparatus, comprising:
a light-emission unit that emits exposure light;
a mask stage that holds an exposure mask;
a workpiece stage that holds a workpiece;
a projection optical system that irradiates the workpiece held by the workpiece stage with the exposure light, the exposure light being emitted from the light-emission unit and passing through the exposure mask;
a lens barrel that holds the projection optical system and is directly connected to the mask stage;
a relative-position changing mechanism that changes at least one of a relative position or a relative angle of the exposure mask relative to the lens barrel; and
a sensor mechanism includes one or more detection sensors that are capable of detecting at least one of a position or an angle of an object to be detected, the sensor mechanism detecting at least one of the relative position or the relative angle of the exposure mask relative to the lens barrel, the at least one of the relative position or the relative angle being changed by the relative-position changing mechanism.

2. The exposure apparatus according to claim 1, wherein the relative-position changing mechanism changes at least one of a relative distance of the exposure mask relative to the lens barrel in an optical axis direction of the exposure light emitted from the light-emission unit, a relative position of the exposure mask relative to the lens barrel in a plane direction perpendicular to the optical axis direction, or a relative inclination of the exposure mask relative to the lens barrel.

3. The exposure apparatus according to claim 2, wherein the relative-position changing mechanism changes the relative inclination of the exposure mask relative to the lens barrel.

4. The exposure apparatus according to claim 1, wherein the sensor mechanism detects at least one of a relative distance of the exposure mask relative to the lens barrel in an optical axis direction of the exposure light emitted from the light-emission unit, a relative position of the exposure mask relative to the lens barrel in a plane direction perpendicular to the optical axis direction, or a relative inclination of the exposure mask relative to the lens barrel.

5. The exposure apparatus according to claim 4, wherein the sensor mechanism detects the relative inclination of the exposure mask relative to the lens barrel.

6. The exposure apparatus according to claim 1, wherein the relative-position changing mechanism includes at least one of
a mask-side moving mechanism that changes at least one of a relative position or a relative angle of the exposure mask relative to the mask stage, or a stage-side moving mechanism that changes at least one of a relative position or a relative angle of the mask stage relative to the lens barrel.

7. The exposure apparatus according to claim 6, wherein the mask stage includes a connection member that is connected to the lens barrel, and a mask-holding member that holds the exposure mask, and the mask-side moving mechanism changes at least one of a relative position or a relative angle of the mask-holding member relative to the connection member.

8. The exposure apparatus according to claim 6, wherein the mask stage includes a connection member that is connected to the lens barrel, and a mask-holding member that holds the exposure mask, and the stage-side moving mechanism changes at least one of a relative position or a relative angle of the connection member relative to the lens barrel.

9. The exposure apparatus according to claim 1, wherein at least one of the one or more detection sensors is fixed to the holding member lens barrel.

10. The exposure apparatus according to claim 1, wherein the mask stage includes a connection member that is connected to the lens barrel, and a mask-holding member that holds the exposure mask, and the one or more detection sensors include at least one of a mask-side detection sensor that sets the exposure mask or the mask-holding member as an object to be detected, or an optical-system-side detection sensor that sets the lens barrel as an object to be detected.

11. The exposure apparatus according to claim 10, wherein the one or more detection sensors include at least one of the mask-side detection sensor that is fixed to the lens barrel, or the optical-system-side detection sensor that is fixed to the mask-holding member.

12. The exposure apparatus according to claim 10, wherein the one or more detection sensors include at least one of three mask-side detection sensors that set three different positions of the exposure mask or the mask-holding member as objects to be detected, or three optical-system-side detection sensors that set three different positions of the lens barrel as objects to be detected.

13. The exposure apparatus according to claim 12, wherein the one or more detection sensors include three mask-side detection sensors that are fixed to the lens barrel with the three different positions of the exposure mask or the mask-holding member as objects to be detected.

14. The exposure apparatus according to claim 12, wherein the one or more detection sensors include three optical-system-side detection sensors that are fixed to the mask-holding member with the three different positions of the lens barrel as objects to be detected.

15. The exposure apparatus according to claim 1, wherein the one or more detection sensors include at least one of a laser interferometer or an autocollimator.

* * * * *